(12) United States Patent
Kuwabara et al.

(10) Patent No.: US 8,132,505 B2
(45) Date of Patent: Mar. 13, 2012

(54) IMPRINT APPARATUS AND IMPRINT METHOD

(75) Inventors: Kosuke Kuwabara, Ibaraki (JP); Takashi Ando, Ibaraki (JP); Masahiko Ogino, Ibaraki (JP); Hiroshi Yoshida, Ibaraki (JP); Yasuhiko Tada, Ibaraki (JP)

(73) Assignee: Hitachi High-Technologies Corporation, Tokyo (JP)

( * ) Notice: Subject to any disclaimer, the term of this patent is extended or adjusted under 35 U.S.C. 154(b) by 1284 days.

(21) Appl. No.: 11/774,216

(22) Filed: Jul. 6, 2007

(65) Prior Publication Data

US 2008/0041248 A1 Feb. 21, 2008

(30) Foreign Application Priority Data

Jul. 7, 2006 (JP) .................. 2006-188369

(51) Int. Cl.
*B31F 1/07* (2006.01)
(52) U.S. Cl. ......................................... 101/32
(58) Field of Classification Search ...................... 101/32
See application file for complete search history.

(56) References Cited

U.S. PATENT DOCUMENTS

| | | | | |
|---|---|---|---|---|
| 5,669,303 A * | 9/1997 | Maracas et al. | ............... | 101/327 |
| 5,947,027 A * | 9/1999 | Burgin et al. | ............... | 101/474 |
| 6,757,116 B1 | 6/2004 | Curtiss et al. | | |
| 6,939,120 B1 * | 9/2005 | Harper | ............... | 425/384 |
| 7,082,876 B2 * | 8/2006 | Olsson | ............... | 101/483 |
| 7,600,993 B2 * | 10/2009 | Kataho et al. | ............... | 425/385 |
| 2003/0213382 A1 * | 11/2003 | Kendale et al. | ............... | 101/41 |
| 2005/0181293 A1 * | 8/2005 | Lee | ............... | 430/98 |
| 2006/0130692 A1 * | 6/2006 | Peterman et al. | ............... | 101/485 |

FOREIGN PATENT DOCUMENTS

| | | |
|---|---|---|
| JP | 1-276449 | 11/1989 |
| JP | 2000-323461 | 11/2000 |
| JP | 2005-100584 | 4/2005 |
| JP | 2005-116978 | 4/2005 |
| JP | 2005-529436 | 9/2005 |
| JP | 2005-310247 | 11/2005 |
| WO | WO 03/104898 A1 | 12/2003 |

* cited by examiner

*Primary Examiner* — Jill Culler

(74) *Attorney, Agent, or Firm* — Antonelli, Terry, Stout & Kraus, LLP.

(57) ABSTRACT

The present invention provides an imprint apparatus transferring a surface structure of a stamper to material to be patterned by allowing the stamper come in contact with the material to be patterned. The imprint apparatus includes a holding means that holds the material to be patterned and the stamper with a distance therebetween, a pressure reduction means that reduces pressure of a chamber in which the material to be patterned and the stamper are placed, and an alignment means that aligns the stamper with the material to be patterned.

17 Claims, 15 Drawing Sheets

IMPRINT APPARATUS AND IMPRINT METHOD

CROSS-REFERENCE TO RELATED APPLICATION

This application claims the foreign priority benefit under 35 U.S.C. §119 of Japanese Patent Application No. 2006-188369 filed on Jul. 7, 2006, the disclosure of which is incorporated herein by reference.

BACKGROUND OF THE INVENTION

1. Field of the Invention

The present invention relates to an imprint apparatus for transferring a surface structure of a stamper onto a surface of material to be patterned.

2. Description of the Related Art

Recently, integrating (fining) techniques for a semiconductor integrated circuit have been advanced. In order to realize such a fine fabrication, more preciseness has been pursued in pattern fabrication of a semiconductor integrated circuit by using a photolithographer, for example. On the other hand, needs in such a fine fabrication have almost reached a limit to shorten wavelength of an exposure light source, so that ultra-fining techniques have been facing a limit of fine patterning. Consequently, for the sake of achieving an even higher preciseness of pattern fabrication, there are utilized an electron beam lithography apparatus which is a variation of a charged particle beam apparatus, taking the place of a photolithography apparatus.

However, in an electron beam lithography patterning, the more patterns to be patterned by an electron beam there are, the longer exposure (patterning) time is needed, which is different from a case of a batch exposure using a light source such as i-ray or excimer laser. Consequently, as integration of a semiconductor integrated circuit is advanced, longer time for pattern fabrication is required, which results in significant decrease in throughput.

In order to enhance pattern fabrication speed by using an electron beam lithography apparatus, a batch graphic radiation method has been developed, in which masks in a variety of shapes are combined and exposed to an electron beam at a time. However, an electron beam lithography apparatus utilizing this batch graphic radiation method becomes bigger in scale and requires a further system for controlling mask positions at a high accuracy, which brings a problem of higher cost in the entire apparatus itself.

As another pattern fabrication technique, an imprint method has been known, in which a predetermined stamper is pressed so as to transfer a surface structure thereof. In this imprint method, a stamper provided with projected and recessed patterns reversely corresponding to projected and recessed patterns to be pattered is pressed onto a surface of material to be patterned, whereby a fine structure with a width between each projected and recessed patterns of 25 nm or less is fabricated on the material to be patterned. Such an imprint method can fabricate fine patterns in a lower cost, for example, in a process of manufacturing mass storage media or semiconductor integrated circuits.

In this imprint method, it is necessary to previously align the stamper with the material to be patterned at a high accuracy before pressing the stamper onto the material to be patterned.

Conventionally, as a method for aligning a stamper with material to be patterned, such a method has been known, in which there is provided alignment patterns on each surface of the stamper and the material to be patterned. Then, the alignment patterns are monitored in an optical way so as to align the stamper with the material to be patterned (as disclosed in Patent Documents 1 and 2, for example). In this method, since the alignment is carried out in an optical way, a high accuracy of the alignment can be achieved. However, this method has a disadvantage in that alignment patterns have to be provided on both the stamper and the material to be patterned, which causes the manufacturing process more complicated. In this method, there is also another disadvantage in that this method cannot be applicable to such a case, for example, of a disk substrate for magnetic recording medium with which substantially no alignment patters can be provided.

To counter this problem, there has been known another method for aligning a stamper with a disk substrate for magnetic recording medium, in which an adjusting pin is inserted in each center hole having an approximately same diameter, which is provided on a disk substrate and a stamper respectively (Patent Documents 3, 4, 5, for example). In this method, an alignment pin is inserted into the center holes of the stamper and the disk substrate which are stacked and aligned to each other, whereby they are aligned at a position where each hole thereof are stacked and aligned. In this way, this method provides a horizontal alignment between a disk substrate and a stapmer in a simple process without providing special alignment patterns.

Patent Document 1: JP 2000-323461A
Patent Document 2: JP 2005-116978A
Patent Document 3: WO 03/104898 A
Patent Document 4: U.S. Pat. No. 6,757,116 B
Patent Document 5: JP 2005-100584A However, in such an alignment method using an alignment pin (see Patent Documents 3, 4, 5, for example), since an alignment is performed while a stamper and a disk substrate are stacked, air bubbles are likely to be involved between the stamper and the disk substrate, that is, on a surface to be transferred. To counter this problem, it may be considered that a stamper and a disk substrate are aligned in a vacuum atmosphere so as to eliminate such bubbles between the stamper and the disk substrate. However, even under a vacuum atmosphere, it is impossible to completely eliminate the bubbles between the stamper and the disk substrate as far as they are placed in a stacked condition. Remaining bubbles may cause a problem of hindering an accurate pattern fabrication.

Therefore, it has been desired to provide an imprint apparatus and method for preventing bubbles from remaining between a stamper and material to be patterned, so as to realize a high accurate pattern fabrication.

SUMMARY OF THE INVENTION

In one aspect of the present invention, there is provided an imprint apparatus transferring a surface structure of a stamper to material to be patterned by allowing the stamper come in contact with the material to be patterned. The imprint apparatus includes a holding means that holds the material to be patterned and the stamper with a distance therebetween, a pressure reduction means that reduces pressure of a chamber in which the material to be patterned and the stamper are placed, and an alignment means that aligns the stamper with the material to be patterned.

In another aspect of the present invention, there is provided an imprint method for transferring a surface structure of a stamper onto material to be patterned. The method includes a first step of holding the material to be patterned and the stamper with a distance therebetween, a second step of reducing pressure of a chamber in which the material to be patterned and the stamper, and a third step of aligning the stamper with the material to be patterned.

Other features and advantages of the present invention will become more apparent from the following detailed descriptions of the invention when taken in conjunction with the accompanying exemplary drawings.

DETAILED DESCRIPTION OF THE PREFERRED EMBODIMENTS

First Embodiment

Figure 1A:
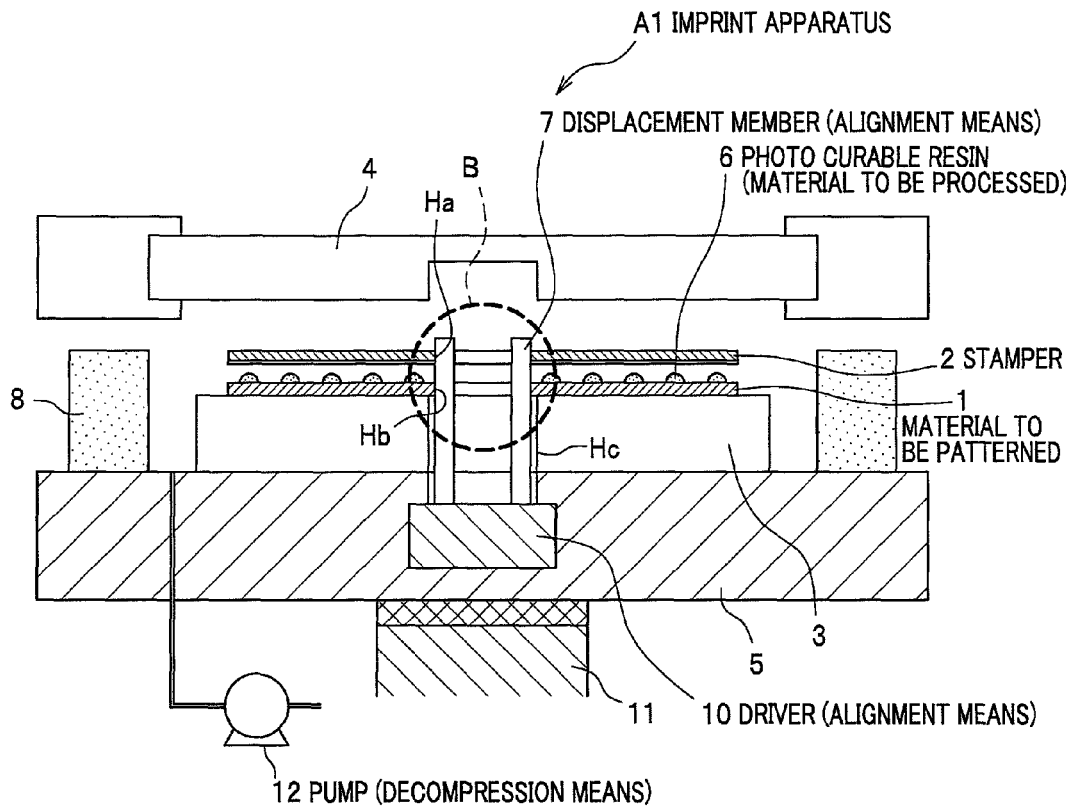
FIG. 1A is a view for explaining a structure of an imprint apparatus according to a first embodiment.
Figures 1B, 1C:
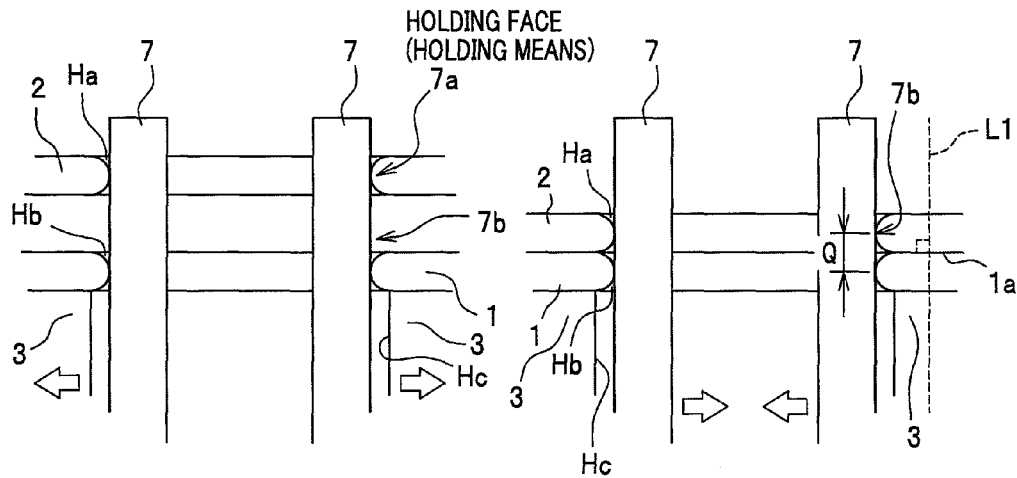
FIG. 1B is an enlarged view of a part indicated by a reference numeral B in FIG. 1A.
FIG. 1C is a schematic view showing a part in vicinity of displacement members in a condition in which a stamper and material to be patterned contact with each other.

A first embodiment of the present invention will be described in detail with reference to accompanying drawings if necessary. Of those drawing, FIG. 1A is a view for explaining a structure of an imprint apparatus according to the first embodiment; FIG. 1B is an enlarged view of a part indicated by a reference numeral B in FIG. 1A; and FIG. 1C is a schematic view to show a part in vicinity of displacement members in a condition in which a stamper and material to be patterned contact with each other. Herein, the present invention will be specifically described by exemplifying an imprint apparatus that manufactures a disk substrate for magnetic recording medium having fine projected and recessed patterns on its surface.

As shown in FIG. 1A, the imprint apparatus A1 includes a movable stage 5 that moves upward and downward by a known up-down mechanism 11; an upper plate 4 of transparent material provided above the movable stage 5; a lower plate 3 provided on the movable stage 5; a stamper 2 provided above the lower plate 3, a vacuum seal 8 provided on the movable stage 5 so as to surround circumferences of the lower plate 3 and the stamper 2; displacement members 7 that are displaced as described later by a driver 10; and a pump 12. This imprint apparatus A1 includes an electromagnetic wave irradiation source (not shown) that is provided either on an upper face side of the upper plate 4 (on a face opposite to an opposing face thereof to the stamper) or is incorporated in the upper plate 4, so as to cure photo curable resin (described later). This electromagnetic wave irradiation source may include a light source of ultraviolet-ray light or the like. It should be noted that the pump 12 is also referred to as a "pressure reduction means", the displacement members 7 are also referred to as an "alignment means" together with the driver 10.

The lower plate 3 is made of a disk-plate member on which the material to be patterned 1 that is to be a parent material of the above mentioned disk substrate is placed. The displacement members are inserted into a through hole Hc which is circular in a plane view and provided at a center of the lower plate 3. A vacuum chuck (not shown) is provided on the lower plate 3 onto which the material to be patterned 1 is held.

The upper plate 4 is made of a disk-plate member that comes in contact with the stamper 2, and a recessed portion is formed at a center thereof so as to avoid contact with the displacement members 7.

The vacuum seal 8 seals the material to be patterned 1 and the stamper 2 in such a manner that the material to be patterned 1 and the stamper 2 are sandwiched between the movable stage 5 and the upper plate 4 when the movable stage 5 is moved upward by the up-down mechanism 11, thereby to form a chamber. The vacuum seal 8 is made of elastic material.

The stamper 2 serves for transferring predetermined fine projected and recessed patterns onto the material to be patterned 1, and there is formed on a face of the stamper 2 opposing the material to be patterned 1 a surface structure reversely corresponding to the projected and recessed patterns to be formed on the material 1. This stamper 2 is made of a disk-plate member, and a through hole Ha is formed at a center thereof. The through hole Ha is circular in a plane view and is also referred to as a "center hole".

Transparent material such as glass may be used for the stamper 2 according to the first embodiment since it is required to radiate electromagnetic waves of UV light or the like to the photo curable resin 6 (described later) through the stamper 2. As described later, if a different material to be processed other than the photo curable resin 6 is used, there is no specific limitation to the material of the stamper 2 as far as it has enough strength and processability; and silicon, metal or resin may generally be used, for example.

The surface pattern of the stamper 2 may be formed by using a known technique as photolithograph, focused ion beam lithography or plating. On such a surface of the stamper 2, it is preferable to apply a fluorine or silicone mold lubricant. After being applied with such a lubricant on its surface, detachment property of the stamper 2 is enhanced so that the stamper 2 is easily detached from the material to be patterned 1 or the photo curable resin (described later) provided on the material to be patterned 1.

The material to be patterned 1 is made of a disk-plate member having a circular through hole Hb in a plane view at a center thereof. The through hole Hb has a diameter that is the same as that of the through hole Ha of the stamper 2 and smaller than that of the through hole Hc of the lower plate 3.

Although the material to be patterned 1 of this embodiment is made of glass in this embodiment, in a different usage of the material to be patterned 1 other than a disk substrate, metal such as aluminium alloy ceramics, silicon or the following resin may be used as the material to be tranasfered 1: polycarbonate, cycloolefin polymer, polymethyl methacrylate, polystyrene, polyethylene terephthalate, polylactic acid, polypropylene, polyethylene, polyvinyl alcohol.

As described above, on the material to be patterned 1, the photo curable resin 6 is uniformly applied on the material to be patterned 1 as described above. The surface structure of the stamper 2 is transferred onto the photo curable resin 6 on the material to be patterned 1, so as to form the predetermined patterns are formed onto this material to be patterned 1. It should be noted that the photo curable resin 6 is also referred to as a "material to be processed" in the descriptions of the present invention. The material to be processed is not limited to the photo curable resin 6 as far as the surface structure of the stamper 2 can be transferred as desired, and may include thermosetting resin, thermoplastic resin or the like, instead of using the photo curable resin. If the material to be processed is thermoplastic resin, the temperature of the material to be processed 1 is prepared to be not less than the glass transition temperature of the thermoplastic resin before the stamper 2 comes in contact with the thermoplastic resin on the material to be patterned 1. After the stamper 2 and the thermoplastic resin on the material to be patterned 1 comes in contact, the stamper and the material to be patterned 1 are cooled down so as to cure the resin. If the material to be processed is thermosetting plastic, the temperature of the material to be patterned 1 is set to be not less than a cure temperature of the thermosetting resin after the stamper 2 and the thermosetting resin on the material to be patterned 1 come in contact.

The displacement members 7 are a pair of stick-like members extending upwards from the driver 10 side in approximately parallel to each other, and are inserted through the through hole Ha of the stamper 2 and the through hole Hb of the material to be patterned 1. The displacement members 7 are displaced by the driver 10 in such a direction that a distance therebetween becomes wider or narrower. In other words, the displacement members 7 move in a direction along a contact face 1a between the material to be patterned 1 and the stamper 2 (in a direction along a face on which the patterns are transferred of the material to be patterned 1), as shown in FIG. 1C.

Each end of the displacement members 7 has a holding face 7a for holding the stamper 2, as shown in FIG. 1B. This holding face 7a is designed to hold the stamper 2 by securely contacting an inner circumferential edge of the through hole Ha thereof. The holding face 7a is also referred to as a "holding means". Each holding face 7a holds the material to be patterned 1 and the stamper 2 with a distance therebetween when the driver 10 (see FIG. 1A) makes the distance between the displacement members 7 wider in a direction shown by arrows of FIG. 1B. The holding face 7a releases the held stamper 2 when the driver 10 makes the distance between the displacement members 7a narrower in a direction shown by arrows of FIG. 1C, so as to make the material to be patterned 1 and the stamper 2 come in contact with each other.

At this time, an alignment face 7b is formed on each displacement member 7 under the holding face 7a of FIG. 7A. As shown in FIG. 1C, this alignment face 7b is pressed at the inner circumferential edges of the through hole Ha and the through hole Hb so as to align the stamper 2 with the material to be patterned 1.

It is preferable that the alignment face 7b has an angle within ±2° or less with respect to a vertical line L1 to a contact face 1a between the material to be patterned 1 and the stamper 2. In this embodiment, as shown in FIG. 1C, the angle of the alignment face 7b with respect to the vertical line L1 is 0°, for example.

The pump 12 of FIG. 1A serves for reducing pressure in a space between the movable stage 5 and the upper plate 4 that is sealed with the vacuum seal 8, that is, in the chamber formed by the material to be patterned 1 and the stamper 2.

Next, operations of the imprint apparatus A1 as well as the imprint method according to this embodiment will be described with reference to the drawings if necessary. Of the drawings to be referred to hereinafter, FIGS. 2A to 2D are views for explaining a process of the imprint method of this embodiment. For convenience, the movable stage 5, the vacuum seal 8, the driver 10 and the pump 12 of FIG. 1A are omitted to be illustrated in FIGS. 2A to 2D.

Figure 2A:
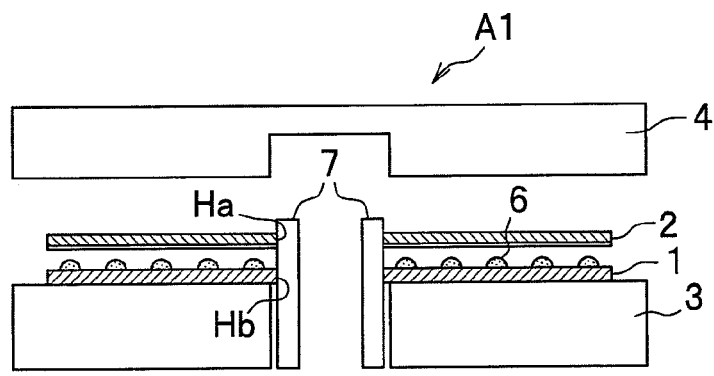
FIGS. 2A to 2D are views for explaining a process of the imprint method of the first embodiment.

As shown in FIG. 2A, the material to be patterned 1 which is provided with the photo curable resin 6 on one face thereof is placed on the lower plate 3, and the stamper 2 is placed above the material to be patterned 1. At this time, the pair of the displacement members 7 is inserted in the through hole Ha of the stamper 2 and the through hole Hb of the material to be patterned 1, and the driver 10 (see FIG. 1A) widens the distance between the pair of the displacement members 7. As a result, as shown in FIG. 1A, the holding face 7a of each displacement member 7 holds the stamper 2 with keeping a distance from the material to be patterned 1. This process is also referred to as a "first process".

Next, the up-down mechanism 11 shown in FIG. 1A lifts the movable stage 5 so that the material to be patterned 1 and the stamp 2 are sealed in the space surrounded by the movable stage 5, the upper plate 4 and the vacuum seal 8. Then, the pump 12 of FIG. 1A operates to reduce pressure in the chamber where the material to be patterned 1 and the stamper 2 are placed. This process is also referred to as a "second process". As a result, the material to be patterned 1 and the stamper 2 with a distance therebetween are exposed in pressure-reduced atmosphere.

Figure 2B:
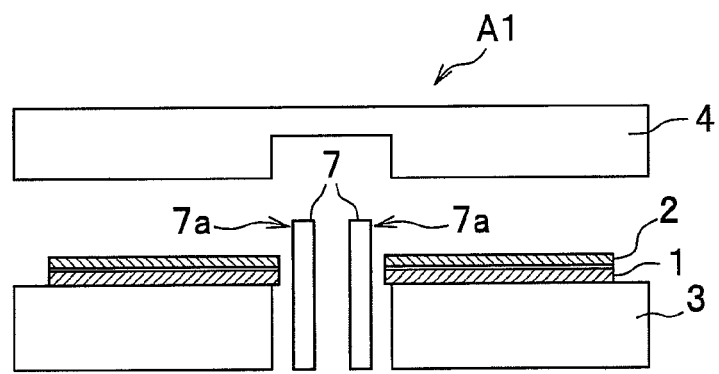

Next, when the driver 10 (see FIG. 1A) narrows the distance between the pair of the displacement members 7, as shown in FIG. 2B, the stamper 2 is released from the holding face 7a so that the stamper 2 falls down by its own weight. This makes the stamper 2 and the material to be patterned 1 come in contact with each other.

Figure 2C:
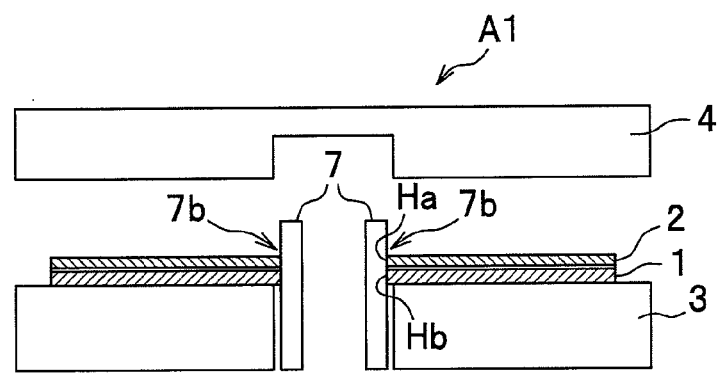

After the stamper 2 and the material to be patterned 1 come in contact with each other, the stamper 2 and the material to be patterned 1 are adjusted with each other. This process is also referred to as a "third process". In this process, as shown in FIG. 2C, the driver 10 (see FIG. 1A) widens the distance between the pair of the displacement members 7. As a result, as shown in FIG. 1C, the holding face 7b of the displacement member 7 is pressed at the inner circumferential edges of the through hole Ha and the through hole Hb.

Figure 2D:
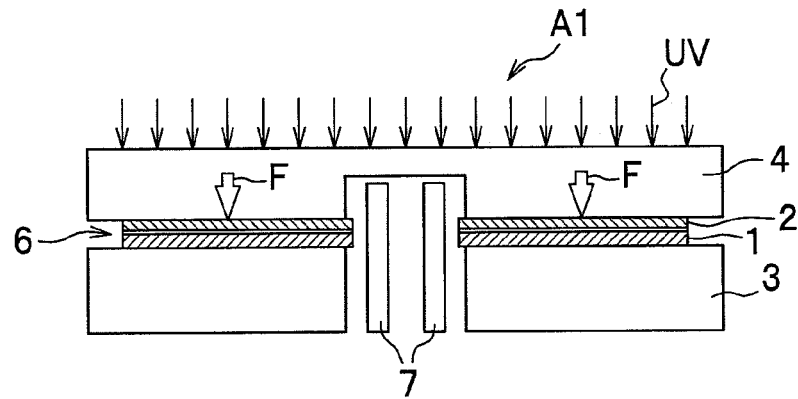

Then, as shown in FIG. 2D, a load F is applied from the upper plate 4 side toward the stamper 2 side if necessary. At this time, the vacuum seal 8 (see FIG. 1A) of elastic material gets elastically deformed due to the load F, and the lower plate 3 and the upper plate 4 place therebetween the stamper 2 and the material to be patterned 1 in contact with each other by applying the load F. As a result, the surface patterns of the stamper 2 are transferred to the photo curable resin 6 on the material to be patterned 1. The load F may be generated in a mechanical way, by using fluid pressure of water, gas or the like, in a non-contact way with electromagnetic force or the like. The load F may be the own weight of the stamper 2 depending on property of the material to be processed such as the photo curable resin 6 or the like. As shown in FIG. 2D, in this embodiment, the UV light is irradiated from the light source (not shown) through the upper plate 4 so that the photo curable resin 6 to which the surface structure of the stamper 2 has been transferred is cured. In this way, there is manufactured a disk substrate for a magnetic recording medium in which the photo curable resin 6 and the material to be patterned 1 are integrated. This magnetic recording medium is finished as a HDD or the like by providing a predetermined magnetic layer on a face on which the surface structure of the disk substrate has been patterned.

According to the imprint apparatus A1 and the imprint method as described above, the material to be patterned 1 and the stamper 2 are held with a distance therebetween and exposed in a pressure-reduced atmosphere, and then they are made to come in contact with each other. Thereby, air bubbles are prevented from remaining in the photo curable resin 6 between the stamper 2 and the material to be patterned 1. As a result, the surface structure of the stamper 2 is precisely transferred to the photo curable resin 6 provided on the material to be patterned 1. As described above, according to the imprint apparatus A1 and the imprint method, it is possible to precisely form the predetermined patterns on the material to be patterned 1.

According to the above mentioned imprint apparatus A1 and the imprint method, the displacement members 7 are pressed at each circumferential edge of the material to be patterned 1 and the stamper 2 so as to align the stamper 2 with the material to be patterned 1. Accordingly, the imprint apparatus A1 and the imprint method of the present embodiment can provide an alignment between the material to be patterned 1 and the stamper 2 in a simple process without providing alignment patterns on the material to be patterned 1 and the stamper 2, which is quite different from conventional imprint techniques in which the alignment is performed in an optical way.

According to such an imprint apparatus A1 and imprint method, it is possible to enhance preciseness of the contact of the alignment face 7b with the stamper 2 and the material to be patterned 1 by setting the angle with respect to the normal line L1 within ±2°. For example, it is assumed that a distance Q (see FIG. 1C) between a contact point of the material to be patterned 1 and the alignment face 7b and a contact point of the stamper 2 and the alignment face 7b is 0.25 mm. If the above mentioned angle with respect to the normal line L1 is set to be within ±2°, the stamper 2 and the material to be patterned 1 can be aligned at an alignment accuracy of 10 μm or less.

Second Embodiment

The second embodiment of the present invention will be described with reference to drawings in necessary. Of the drawings to be referred to hereinafter, FIGS. 3A to 3D are views of explaining displacement members used in an imprint apparatus according to the second embodiment. In the second embodiment, similar components to those in the first embodiment will be indicated with the same reference numerals in the drawings and detailed descriptions therefor will be omitted.

Figure 3A:
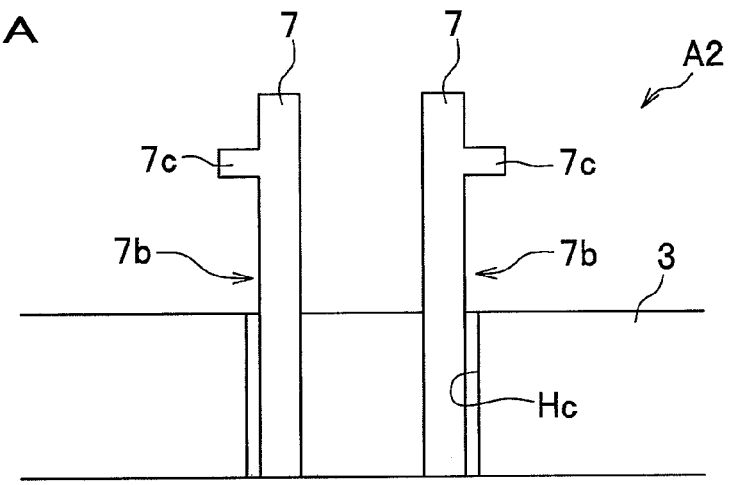
FIGS. 3A to 3D are views of explaining displacement members used in an imprint apparatus according to a second embodiment.

Each displacement member 7 in FIG. 3A is provided with a projection 7c in the vicinity of a tip end thereof. This projection 7c projects from the displacement member 7 in a direction radially outward from the center side of the lower plate 3. This projection 7c is also referred to as a "holding means" and a "locking portion".

Figure 3B:
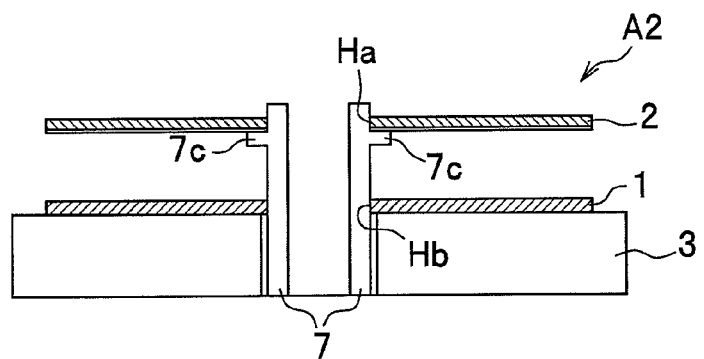

As shown in FIG. 3B, in the imprint apparatus A2 having such displacement members 7, when the driver 10 (see FIG. 1A) widens a distance between the displacement members 7, the tip ends displacement members 7 are inserted in the through hole Ha of the stamper 2. Then, the stamper 2 is locked at the circumferential edge of the through hole Ha by the projection 7c, so that the stamper 2 is held with a distance between the stamper 2 and the material to be patterned 1.

Figure 3C:
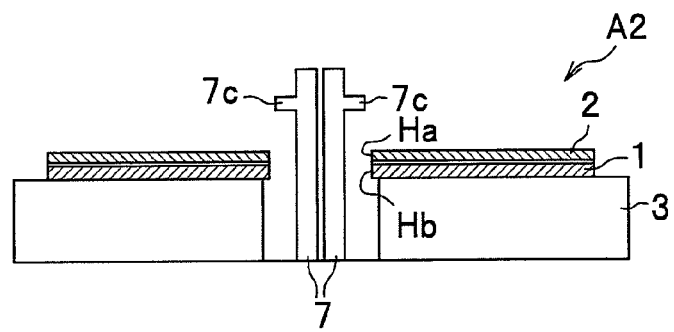

In the imprint apparatus A2, as shown in FIG. 3C, when the driver 10 (see FIG. 1A) narrows the distance between the displacement members 7, the projections 7c release the stamper 2 that has been locked, so as to make the material to be patterned 1 and the stamper 2 come in contact with each other. Then, the released stamper 2 falls down by its weight so that the stapmer comes in contact with the material to be patterned 1.

Figure 3D:
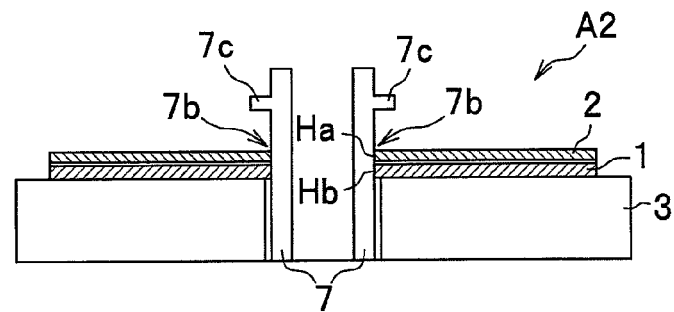

Thereafter, the alignment face 7b of each displacement member 7, as shown in FIG. 3D, is pressed at each inner circumferential edge of the through hole Ha and the through hole Hb while the stamper and the material to be patterned 1 are in contact with each other, thereby to align the stamper 2 with the material to be patterned 1.

The displacement member 7 having such a projection 7c more securely holds the material to be patterned 1, compared to the displacement member 7 of the first embodiment.

Third Embodiment

The third embodiment will be described in details, with reference to drawings if necessary. Of the drawings to be referred to hereinafter, FIGS. 4A to 4D are views of explaining displacement members used in an imprint apparatus according to the third embodiment. In the third embodiment, similar components to those in the first and second embodiments will be indicated with the same reference numerals in the drawings and detailed descriptions therefor will be omitted.

Figure 4A:
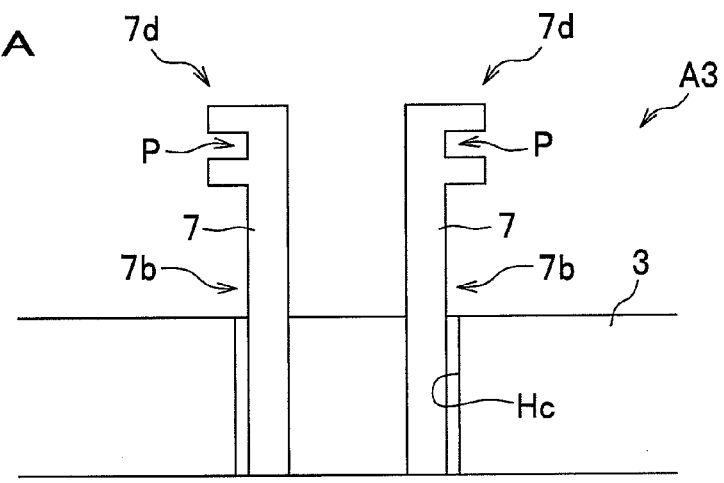
FIGS. 4A to 4D are views of explaining displacement members used in an imprint apparatus according to a third embodiment.
Figure 4B:
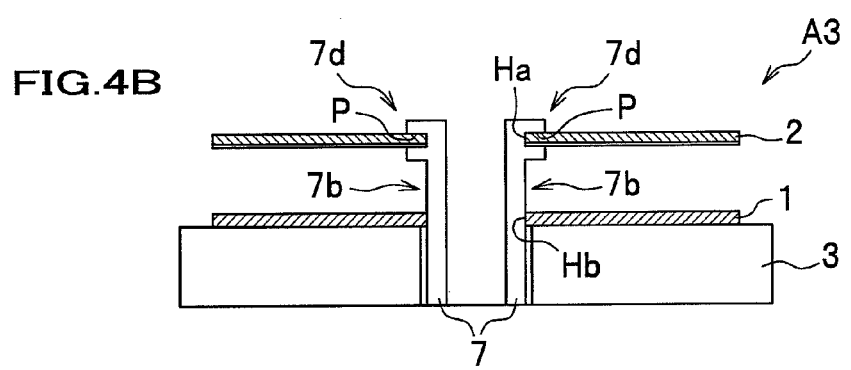

Each displacement member 7 in FIG. 4A is provided with a projection 7d in the vicinity of a tip end thereof. This projection 7d projects from the displacement member 7 in a direction radially outward from the center side of the lower plate 3. This projection 7d is also referred to as a "holding means" and a "locking portion". There is provided with a recessed portion P on the projection 7d. As shown in FIG. 4B, in the imprint apparatus A3 having such displacement members 7, when the driver 10 (see FIG. 1A) widens a distance between the displacement members 7, the circumferential edge of the through hole Ha of the stamper 2 is engaged in the recessed portions P so as to be locked with the displacement members 7. Thereby, the stapmer 2 is held with a distance between the stamper 2 and the material to be patterned 1.

Figure 4C:
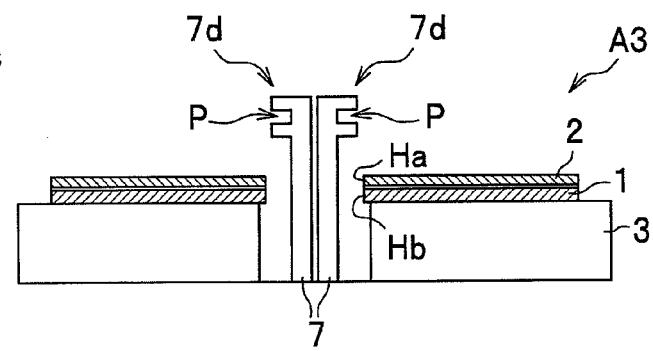

In the imprint apparatus A3, as shown in FIG. 4C, when the driver 10 (see FIG. 1A) narrows the distance between the displacement members 7, the projection 7d releases the stamper 2 that has been locked, so as to make the material to be patterned 1 and the stamper 2 come in contact with each other. Then, the released stamper 2 falls down by its weight so that the stapmer comes in contact with the material to be patterned 1.

Figure 4D:
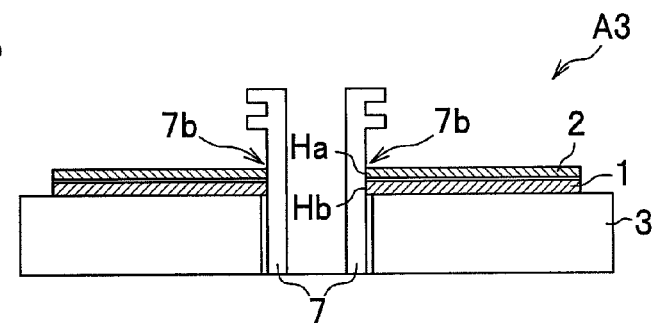

Thereafter, the alignment face 7b of each displacement member 7, as shown in FIG. 4D, is pressed at each inner circumferential edge of the through hole Ha and the through hole Hb while the stamper 2 and the material to be patterned 1 are in contact with each other, thereby to align the stamper 2 with the material to be patterned 1.

The displacement member 7 having such a projection 7d holds the material to be patterned 1 more securely, compared to the displacement members 7 of the first embodiment and the second embodiment.

Fourth Embodiment

The fourth embodiment will be described in details, with reference to drawings if necessary. Of the drawings to be referred to hereinafter, FIGS. 5A to 5D are views of explaining displacement members used in an imprint apparatus according to the fourth embodiment. In the fourth embodiment, similar components to those in the first embodiment through the third embodiment will be indicated with the same reference numerals in the drawings and detailed descriptions therefor will be omitted.

Figure 5A:
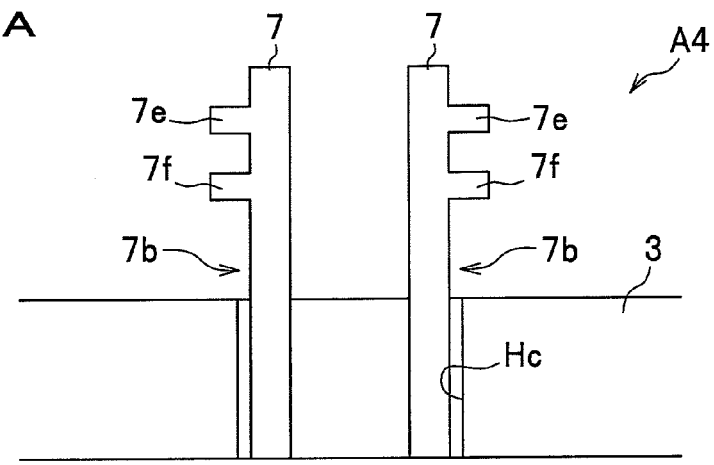
FIGS. 5A to 5D are views of explaining displacement members used in an imprint apparatus according to a fourth embodiment.

Each displacement member 7 in FIG. 5A is provided with a projection 7e and a projection 7f in the vicinity of a tip end thereof. The projection 7e and the projection 7f respectively project from the displacement member 7 in a direction radially outward from the center side of the lower plate 3. These projections 7e and 7f are also referred to as a "holding means" and a "locking portion".

Figure 5B:
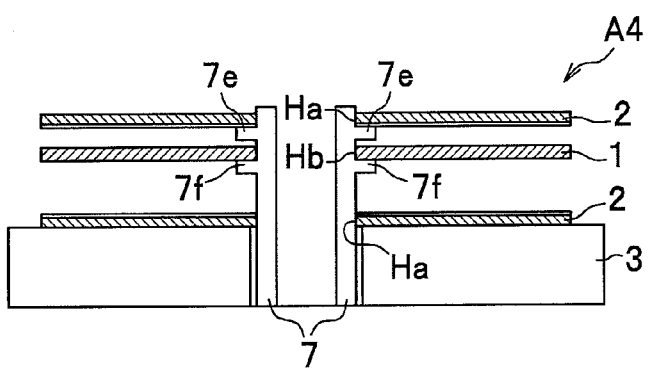

As shown in FIG. 5B, in the imprint apparatus A4 having such displacement members 7, there are placed a lower stamper 2, an upper stamper 2 and a material to be patterned 1, specifically, the lower stamper 2 is placed on the lower plate 3 and the tip end of the displacement members 7 are completely inserted into the through hole Ha of the upper stamper 2 when the driver 10 (see FIG. 1A) widens the distance between the displacement members 7. Then the upper stamper 2 is locked at the circumferential edge of the through hole Ha thereof by the projections 7e.

At the same time, the material to be patterned 1 is locked at the circumferential edge of the through hole Hb thereof by the projections 7f when the driver 10 (see FIG. 1A) widens the distance between the displacement members 7. In other words, the material to be patterned 1 and the lower and upper stampers 2, 2 are held with a distance therebetween.

Figure 5C:
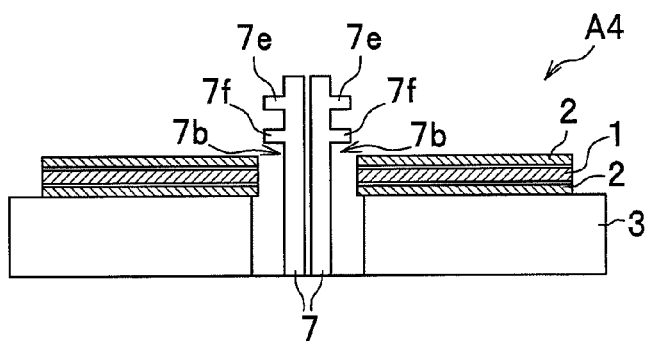

In this imprint apparatus A4, as shown in FIG. 5C, the driver 10 (see FIG. 1A) narrows the distance between the displacement members 7 so that the projections 7e, 7f release the locked upper stapmer 2 and the material to be patterned 1, thereby to make the material to be patterned 1 and the upper stamper 2 come in contact with each other. Then, the released upper stamper 2 and the material to be patterned 1 fall down by their own weight. As a result, the lower stamper 2, the material to be patterned 1 and the upper stamper 2 come in contact with one another in this order.

Figure 5D:
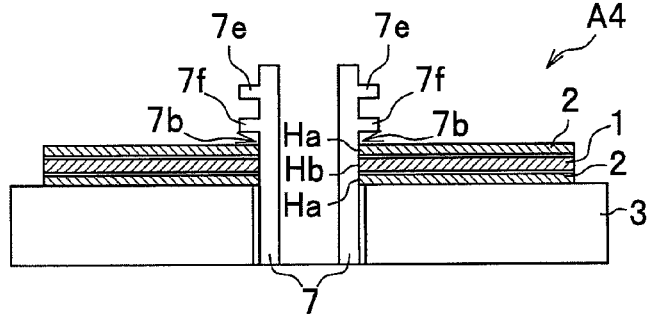

As shown in FIG. 5D, the alignment face 7b of each displacement members 7 is pressed at the inner circumferential edges of the through hole Ha and the through hole Hb while the lower and upper stampers 2, 2 and the material to be patterned 1 are in contact with one another, thereby to align the stampers 2, 2 with the material to be patterned 1.

The imprint apparatus A4 having such displacement members 7 can form patterns on both faces of the material to be patterned 1.

Fifth Embodiment

Figure 6A:
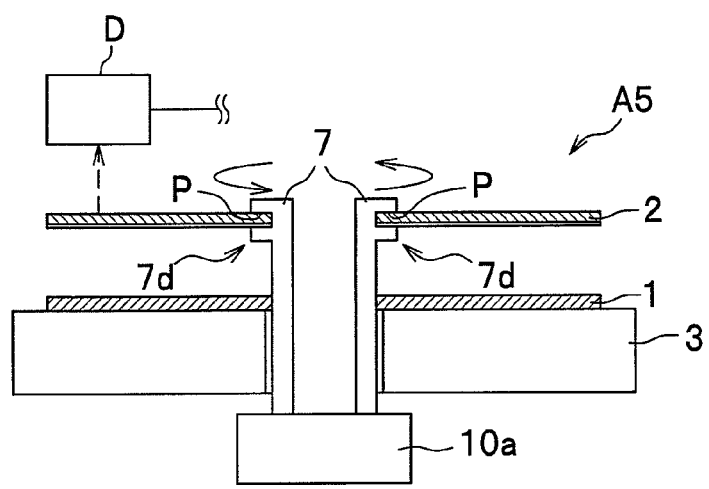
FIGS. 6A and 6B are views of explaining displacement members used in an imprint apparatus according to a fifth embodiment.
Figure 6B:
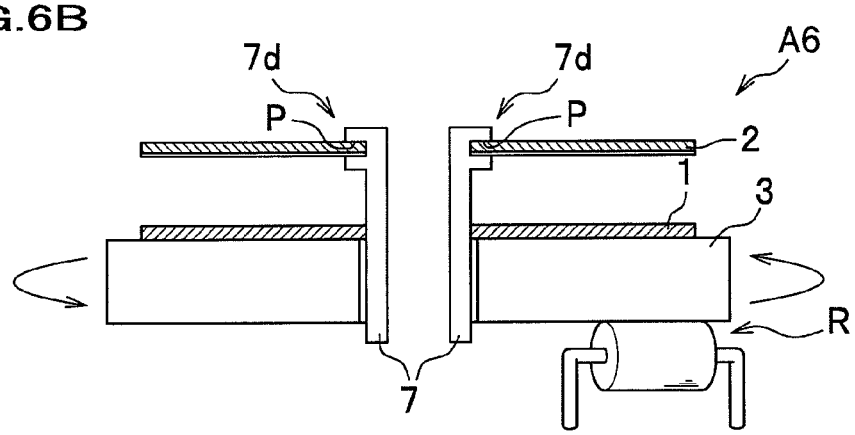

Of the drawings to be referred to hereinafter, FIGS. 6A and 6B are views of explaining displacement members used in an imprint apparatus according to the fifth embodiment. In the fifth embodiment, similar components to those in the first embodiment through the fourth embodiments will be indicated with the same reference numerals in the drawings and detailed descriptions therefor will be omitted.

As shown in FIG. 6A, the imprint apparatus A5 of the fifth embodiment includes displacement members 7 having the same projection 7d as that of the displacement members 7 of the third embodiment, as well as a driver 10a for operating the displacement members 7 used in the imprint apparatus A5.

As similar to the driver 10 (see FIG. 1A) of the first embodiment, the driver 10a is designed to widen or narrow the distance between the displacement members 7 and rotate the stamper 2 around a central axis thereof. The driver 10a is also referred to as a "rotational driving unit".

This imprint apparatus A5 is provided with a marker (not shown) on an upper face of the stamper 2, and a detector D detects a position of the marker so as to determine a rotational angle of the stamper 2. This imprint apparatus A5 is designed to align the stamper 2 with the material to be patterned 1 based on the rotational angle detected by the detector D.

As shown in FIG. 6A, the present invention may employ an imprint apparatus A6 that rotates the lower plate 3 around the rotational axis thereof. Such an imprint apparatus A6 is designed to rotate the lower plate 3 by using a (rotational) roller R. This imprint apparatus A6 may also be designed to align the stamper 2 with the material to be patterned 1 based on a position of the marker (not shown) provided on the material to be patterned 1, which is detected by the detector (not shown).

The imprint apparatuses A5, A6 designed in such a simple structure can realize a high reproducibility of the alignment between the material to be patterned 1 and the stamper 2, which falls within ±10° in terms of a deviation of the rotational angle.

In the fifth embodiment, it is assumed that the marker is readable in an optical way. However, the marker may be one constituted of holes or projections to be detected by touch in a mechanical way.

Sixth Embodiment

Figure 7:
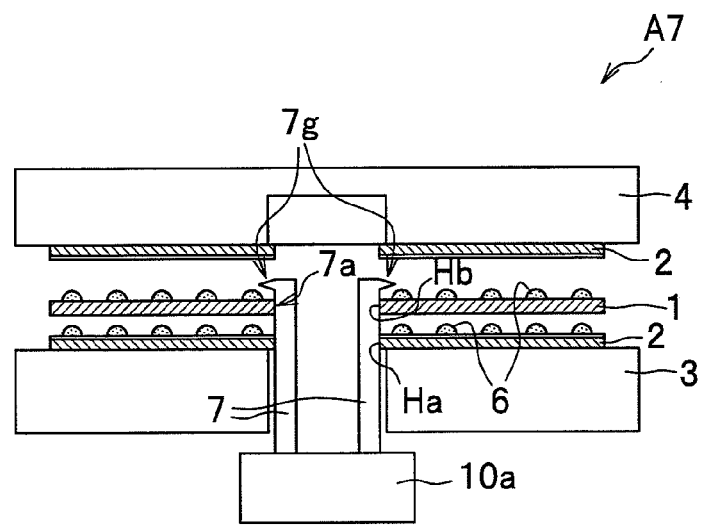
FIG. 7 is a view showing a structure of an imprint apparatus according to the sixth embodiment.

The sixth embodiment will be described in detail with reference to the drawings if necessary. Of the drawings to be referred to hereinafter, FIG. 7 is a view showing a structure of an imprint apparatus according to the sixth embodiment. FIGS. 8A to 8E are explanatory views of a process of the imprint method according to the sixth embodiment. In the sixth embodiment, similar components to those in the first embodiment through the fifth embodiment will be indicated with the same reference numerals in the drawings and detailed descriptions therefor will be omitted. The imprint apparatus according to the sixth embodiment includes the same movable stage 5, vacuum seal 8, up-down mechanism 11 and pump 12 as those of the imprint apparatus according to the first embodiment, and those components will be omitted in FIG. 7 and FIGS. 8A to 8E for convenience.

As shown in FIG. 7, the imprint apparatus A7 has displacement members 7 each of which is provided with a separating portion 7g at an tip end of the members 7. This separating portion 7g projects from the displacement member 7 in a direction radially outward from the center side of the lower plate 3, and formed in a wedge shape at its tip end. The displacement member 7 has a holding face 7a as similar to that of the first embodiment.

As shown in FIG. 7, in the imprint apparatus having such displacement members 7, there are provided transparent lower and upper stampers 2, 2 and a transparent material to be patterned 1. Specifically, the lower stamper 2 is placed on the lower plate 3 side and the upper stamper 2 is fixed on the upper plate 4 side. When the driver 10a widens the distance between the displacement members 7, the holding face 7a of each displacement member 7 is pressed at the inner circumferential edge of the through hole Hb of the material to be patterned 1, so as to lock the material to be patterned 1 at each holding face 7a. Each displacement member 7 is also pressed at the inner circumferential edge of the through hole Ha of the lower stamper 2. In other words, the upper and lower stampers 2, 2 and one material to be patterned 1 are held with a distance therebetween. The photo curable resin 6 is applied on an upper face of the lower stamper 2 on the lower plate 3 side and an upper face of the material to be patterned 1.

Descriptions will be provided on operations of the imprint apparatus according to the present invention, with reference to the drawings if necessary.

Figure 8A:
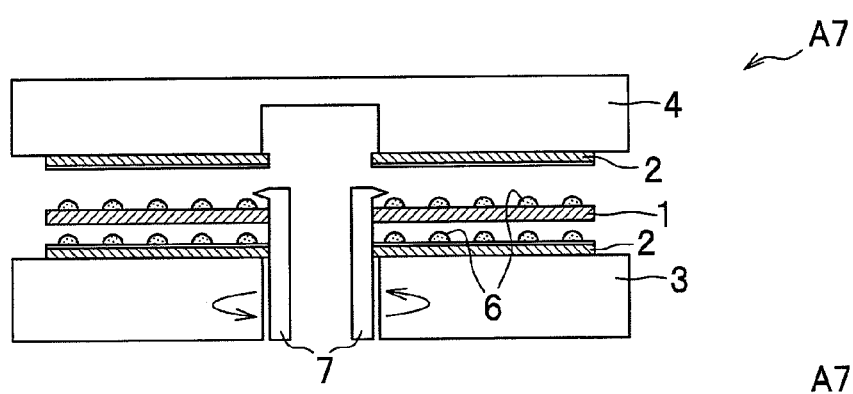
FIGS. 8A to 8E are views of explaining a process of the imprint method according to the sixth embodiment.

As shown in FIG. 8A, in this imprint apparatus A7, when the displacement members 7 are rotated by the driver 10a (see FIG. 7) at a predetermined rotational angle, the lower stamper 2, which is pressed by the displacement member 7, is rotated around the central axis of the displacement member 7. As a result, the upper stamper 2 and the lower stamper 2 are aligned in the circumferential direction thereof. It should be noted that, while the upper and lower stampers 2, 2 and the material to be patterned 1 are held with a distance therebetween, they are exposed to the pressure-reduced atmosphere, as similar in the above embodiments.

Figure 8B:
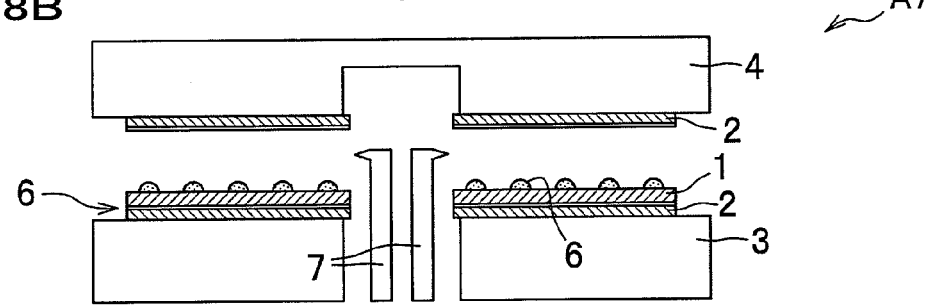

As shown in FIG. 8B, the driver 10a (see FIG. 7) narrows the distance between the pair of the displacement members 7, so that the material to be patterned 1 is released from the holding face 7a (see FIG. 7) and falls down by its own weight. As a result, the lower stamper 2 and the material to be patterned 1 come in contact with each other.

Figure 8C:
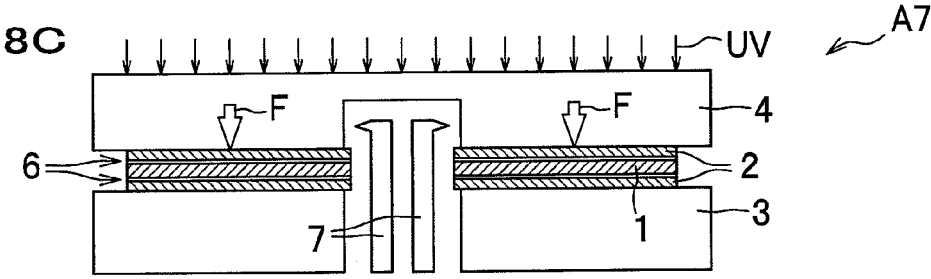

As shown in FIG. 8C, if necessary, a load F may be applied from the upper plate 4 side toward the stampers 2, 2 side. At this time, since the vacuum seal 8 (see FIG. 1A) is made of elastic material and gets elastically deformed due to the load F, the upper plate 3 and the lower plate 4 sandwich the upper stamper 2, the material to be patterned 1 and the lower stamper 2 that are in contact with one another while applying the load F. As a result, the surface structure of the stampers 2, 2 are transferred to the photo curable resin 6 provided on the material to be patterned 1. Depending on the property of material to be processed that is used, such as the photo curable resin 6, the load F may be substituted by the weight of the stamper 2 itself. In this embodiment, as shown in FIG. 8C, UV light is radiated from the light source through the upper plate 4, so that the photo curable resin 6 to which the surface patterns of the stamper(s) 2 has been transferred is cured.

Figure 8D:
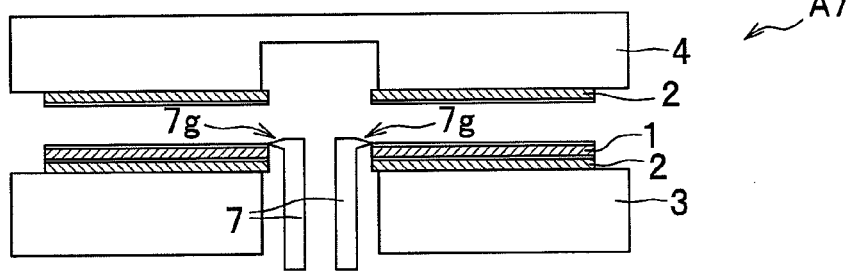
Figure 8E:
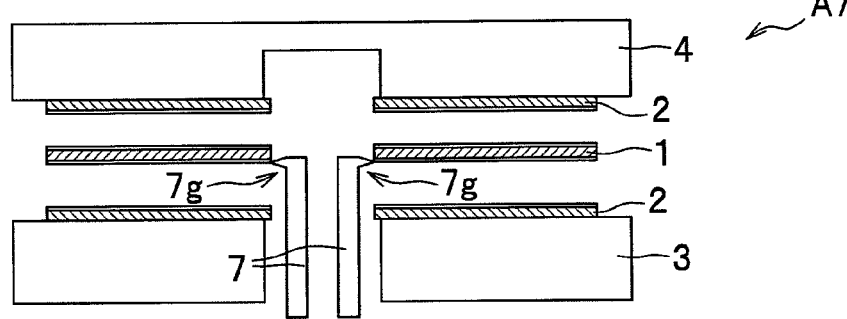

Next, as shown in FIG. 8D, the displacement member 7 is displaced by the driver 10a such that the separating portion 7g of each displacement member 7 is inserted between the upper stamper 2 and the material to be patterned 1, and the lower plate 3 and the upper plate 4 move apart from each other, whereby the upper stamper 2 gets separated from the material to be patterned 1. Thereafter, as shown in FIG. 8E, the displacement member 7 is displaced by the driver 10a such that the separating portion 7g of each displacement member 7 is inserted between the lower stamper 2 and the material to be patterned 1, so that the lower plate 3 and the upper plate 4 move apart from each other, whereby the lower stamper 2 gets separated from the material to be patterned 1. As a result, there is manufactured a disk substrate for a magnetic recording medium, in which the material to be patterned 1 and the photo curable resin 6 on both the faces of the material to be patterned 1 are integrated.

According to the imprint apparatus A7 as described above, it is possible to align the upper and lower stampers 2, 2 with the material to be patterned 1 in the circumferential direction pf the material to be patterned 1, thereby to provide a precisely alignment between the patterns formed on both the faces of the material to be patterned 1.

According to the imprint apparatus A7, the displacement member 7 provided with the separating portion 7g can easily separate the stamper 2 or stampers 2, 2 from the material to be patterned 1.

In the present embodiment, the upper stamper 2 is exemplified to be fixed on the upper plate 4. However it may also be possible that the upper stamper 2 is not fixed and movable at least horizontally, for example; and the alignment range of the displacement members 7 is enlarged enough for the alignment. The lower stamper 2 may also be fixed as similar to the upper stamper 2. For example, the lower stamper 2 and the upper stamper 2 may be fixed on the lower plate 3 and the upper plate 4, respectively.

In this embodiment, the displacement members 7 rotate while being pressed at the material to be patterned 1 and the lower stamper 2, so as to provide the alignment in the circumferential direction between the lower stamper 2 and the upper stamper 2. However, the upper stamper 2 may rotate for this alignment. In addition, the alignment between the lower stamper 2 and the upper stamper 2 in the circumferential direction may also be adjusted in advance, and thereafter the material to be patterned 1 may be placed.

This invention is not limited to the first to sixth embodiments as described above, and may be embodied in diverse variations.

In the above embodiments, the stamper 2 and the material to be patterned 1 are aligned by pressing the displacement members 7 at the inner circumferential edges of the through hole Ha of the stamper 2 and of the through hole Hb of the material to be patterned 1, respectively. However, the present invention may also be embodied, for example, by pressing the displacement members 7 at the outer circumferential edges of the stamper 2 and of the material to be patterned 1, respectively, so as to align the stamper 2 with the material to be patterned 1. According to such an imprint apparatus and imprint method, it may be omitted to provide through holes Ha, Hb for the stamper and the material to be patterned 1, respectively.

Although the above described embodiments exemplified that there are provided a pair of displacement members 7, the present invention may also be embodied by using at least one displacement member 7.

In the descriptions of the above described embodiments, it is assumed that the photo curable resin 6 is applied on the material to be patterned 1 and/or the stamper 2 in advance. However the present invention is not limited to this, and may also employ such an imprint apparatus having a mechanism for automatically applying the photo curable resin 6 by using a dispenser, an inkjet head or the like.

The above described embodiments employ a structure such that the material to be patterned 1 is supported onto the lower plate 3 with the vacuum chuck. However, the present invention is not limited to this, and the material to be patterned 1 may also be supported by pressing the displacement members 7 at the material to be patterned 1.

The above described embodiments exemplify a case in which the material to be patterned 1 that has been patterned on its surface is used for a disk substrate, for convenience. However, the present invention may be applicable to an apparatus and method for manufacturing a high-functional device that requires microstructures, such as recording bits of mass storage medium, optical parts, semiconductor integrated circuits and bio devices.

EXAMPLES

More detailed and specific descriptions will be provided on the present invention, by presenting various examples as follows.

Example 1

In the Example 1, there was provided a groove structure on one face of a disk substrate.

As for a material to be patterned 1, a glass-disk substrate with a diameter of 65 mm, a thickness of 0.6 mm and a through hole Hb having diameter of 20 mm was used. The material to be patterned 1 was prepared such that an outer circumferential edge thereof and an inner circumferential edge of the through hole Hb thereof were chamfered by a width of 0.15 mm, respectively. There was previously applied an acrylate photo curable resin 6 on a face of the material to be patterned 1 in a dispensing method.

As for a stamper 2, a quartz substrate having the same shape of above mentioned material to be patterned 1 was used. On a face of the stamper 2 opposing the material to be patterned 1, there were provided a plurality of concentric grooves in a conventional EB (electron beam direct writing) method. Each of the grooves had a width of 50 nm, a depth of 100 nm and a pitch of 100 nm. The central axis of the grooves was agreed with that of the stamper 2.

Next, as shown in FIG. 2A, the material to be patterned 1 was placed on the lower plate 3. The stamper 2 was transferred above the material to be patterned 1 from the external by using a robot arm (not shown). A pair of the displacement members 7 are pressed at the inner circumferential edges of the through hole Hb of the material to be patterned 1 and of the through hole Ha of the stamper 2, so that the material to be patterned 1 and the stamper 2 were held with a distance therebetween by the displacement members 7. At this time, the distance between the stamper 2 and the material to be patterned 1 was 200 μm.

A movable stage 5 (see FIG. 1A) was lifted by an up-down mechanism 11 (see FIG. 1A), so that a vacuum seal 8 (see FIG. 1A) was sandwiched between the upper plate 4 and the movable stage 5. As a result, a pressure reduction chamber was formed between the upper plate 4 and the movable stage 5, and the pressure-reduced atmosphere in the pressure reduction chamber was set to 1.0 kPa.

Next, as shown in FIG. 2B, released from the displacement members 7, the stamper 2 came in contact with the material to be patterned 1 through the photo curable resin 6. As shown in FIG. 2C, the material to be patterned 1 and the stamper 2 were aligned by the displacement members 7. Then, as shown in FIG. 2D, as the movable stage 5 moves upward, the stamper 2 was pressed with a load F at the material to be patterned 1 between the lower plate 3 and the upper plate 4. While the stamper 2 was pressed at the material to be patterned 1, UV light was radiated. After the photo curable resin 6 became cured, the pressure in the pressure reduction chamber was returned to the atmospheric pressure, and the movable stage 5 was lowered to the original position by the up-down mechanism 11.

Figure 9:
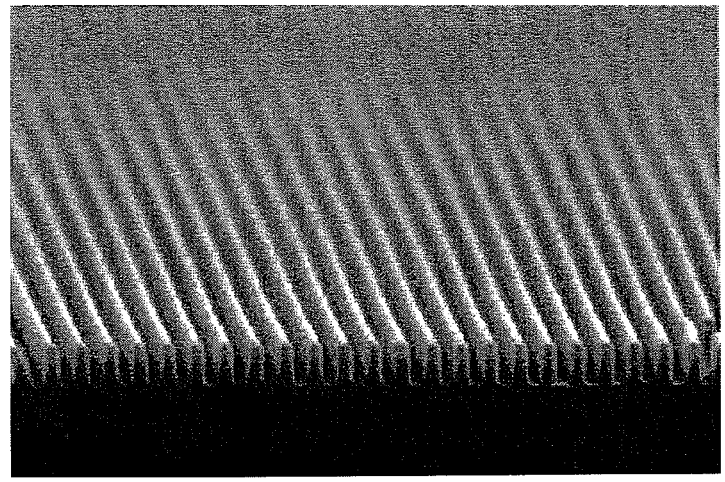
FIG. 9 shows an electron microscope image of a groove structure provided for a disk substrate.

Thereafter, the stamper 2 was separated from the material to be patterned 1. It was observed that the photo curable resin 6 had been cured on the material to be patterned 1, and patterns were transferred on the cured photo curable resin 6 from the surface structure of the stamper 2. The transferred patterns were constituted of grooves with a width of 50 nm, a depth of 100 nm and a pitch of 100 nm. FIG. 9 shows an electron microscope image of the groove structure. Eccentricities between the concentric grooves transferred on the material to be patterned 1 and the alignments by using the through hole Hb were measured repeatedly twenty times. As a result, all the obtained eccentricities fell within 10 μm or less.

Example 2

In Example 2, there were provided a column structure on both faces of a disk substrate.

As for a material to be patterned 1, a glass-disk as similar in the Example 1 was used.

As for a stamper 2, two quartz substrates having the same shape of the material to be patterned 1 were used. On a face of each stamper 2 opposing the material to be patterned 1, there were formed plural pits each of which has a diameter of 0.18 μm, a depth of 0.5 μm and a pitch of 360 nm in a conventional photolithography method, and there was also provided on each stamper 2 an annular line having a diameter of 62 mm, a width of 0.02 mm and a depth of 0.5 μm. A center of this annular line was arranged to be concentric to the central axis of the stamper 2. A straight line was further provided to vertically cross the annular line at one point. This straight line had a length of 2 mm, a width of 00.2 mm and the depth of 0.5 μm, and was used for an alignment mark in the circumferential direction of the stamper 2.

As shown in FIG. 8A, one stamper 2 (hereinafter referred to as an upper stamper 2) was fixed to the upper plate 4. The other stamper 2 (hereinafter referred to as a lower stamper 2) was fixed no the lower plate 3. The stampers 2, 2 were placed in such a manner that a face having a surface structure thereof opposes each other. An acrylate photo curable resin 6 was applied on the upper face of the lower stamper 2.

Then, the material to be patterned 1 having the photo curable resin 6 applied on its one face was provided between the stampers 2, 2. At this time, the material to be patterned 1 was placed such that the face thereof on which the photo curable resin 6 was applied faced upward. The pair of the displacement members 7 were pressed at the inner circumferential edges of the through hole Hb and of the material to be patterned 1 and the through hole Ha of the lower stamper 2, thereby to hold the material to be patterned 1 and the lower stamper 2 with a distance therebetween. The distance therebetween was approximately 200 μm.

The pressure-reduced atmosphere in the pressure reduction chamber which had been formed between the upper plate and the movable stage (not shown) was set to 1.0 kPa. Next, the lower stamper 2 was rotated by the rotating displacement members 7, so that the upper stamper 2 and the lower stamper 2 were aligned with each other. This alignment operation was performed by rotating the displacement members 7 so as to make the alignment marks on the upper and lower stampers 2, 2 agree with each other. This alignment was performed while the alignment marks were monitored with a camera (not shown) through the upper transparent plate 1.

Then, as shown in FIG. 8B, released from the displacement members 7, the material to be patterned 1 came in contact with the lower stamper 2 through the photo curable resin 6. After the material to be patterned 1 and both the stampers 2, 2 came in contact with one another through the photo curable resin 6 by moving the movable stage 5 (not shown) upward, the displacement members 7 were pressed at the material to be patterned 1 and the stampers 2, 2, so as to align the stampers 2, 2 with the material to be patterned 1.

Then, as shown in FIG. 8C, the stampers 2, 2 were pressed at the material to be patterned 1 with the load F between the upper and lower plates 3, 4. In this state, the UV light was radiated.

After the photo curable resin 6 was cured, a separation portion 7g of each displacement member 7 was inserted into a border between the the upper stamper 2 and the material to be patterned 1, thereby to secure an initial point of separation between the upper stamper 2 and the material to be patterned 1. Thereafter, the pressure of the pressure reduction chamber was returned to the atmospheric pressure, and as the lower plate 3 was lowered, the upper stamper 2 was separated from the material to be patterned 1.

Figure 10:
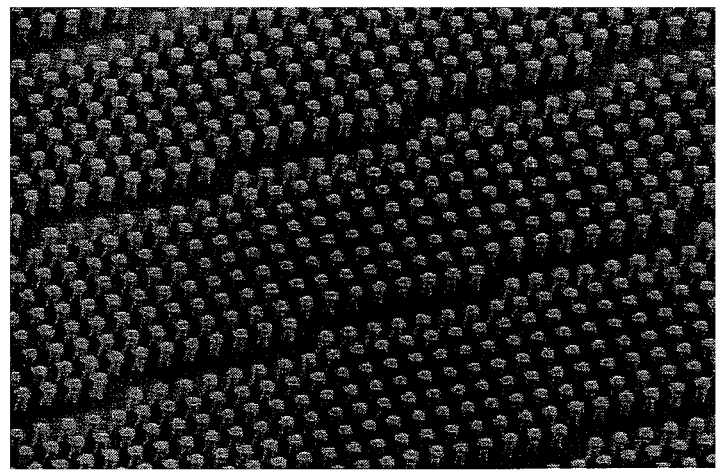
FIG. 10 shows an electron microscope image of a column structure provided for a disk substrate.

Next, as shown in FIG. 8E, the separating portion 7g of each displacement member 7 was inserted in a border between the lower stamper 2 and the material to be patterned 1, thereby to secure an initial point of separation between the stampers 2 and the material to be patterned 1. As the lower plate 3 was lowered, the lower stamper 2 was also separated from the material to be patterned 1. It was observed that the photo curable resin 6 had been cured on both faces of the material to be patterned 1, and patterns were transferred on each photo curable resin 6 from the surface structure of each stamper 2. The patterns had a column-like structure, and each column had a diameter of 0.18 μm, a height of 0.5 μm and a pitch of 360 nm. FIG. 10 shows an electron microscope image of the column structure. Eccentricities between the annular line transferred on the material to be patterned 1 and the alignment by using the through hole Hb of the material to be patterned 1 were measured repeatedly twenty times. As a result, it was observed that all the obtained eccentricities fell to 10 μm or less, and angle deviation of the alignment marks in the circumferential direction on both faces of the material to be patterned 1 fell within 10°.

Example 3

In Example 3, a method for a manufacturing discrete track medium by using the imprint method of the present invention will be described with reference to the drawings if necessary. Of the drawings to be referred to hereinafter, FIGS. 11A to 11D are views for explaining the method for manufacturing the discrete track medium.

Figure 11A:
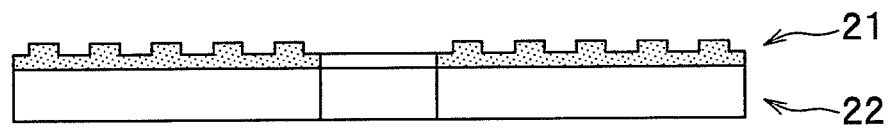
FIGS. 11A to 11D are views for explaining a method for manufacturing a discrete track medium.

As shown in FIG. 11A, there was prepared a glass substrate 22 obtained in the Example 1, in which there was provided on the glass substrate 22 a pattern formation layer 21 constituted of a photo curable resin 6, on which a surface structure of the stamper 2 had been transferred.

Figure 11B:
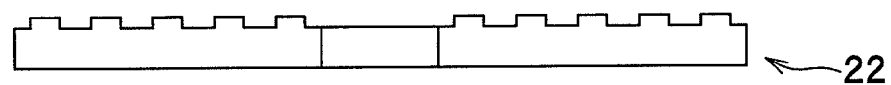

Next, a surface of the glass substrate 22 was processed in a conventional dry etching method, using the pattern formation layer 21 as a mask. As a result, as shown in FIG. 11B, a structure corresponding to the pattern of the pattern formation layer 21 was etched on the surface of the glass substrate 22. In this example, fluorine-containing gas was used for the dry etching. This dry etching may be performed such that, after a thin film part of the pattern formation layer 21 is removed by oxygen plasma etching, the glass substrate 22 exposed is etched with fluorine-containing gas.

Figure 11C:
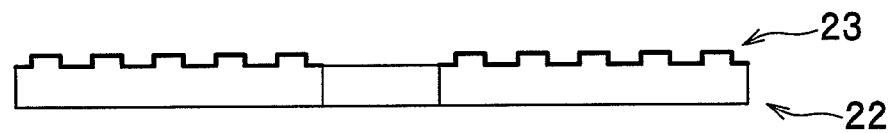

Then, as shown in FIG. 11C, on the glass substrate with the etched structure thereon, there was provided a magnetic recording medium formation layer 23 including a pre-coat layer, a magnetic domain control layer, a soft magnetic underlayer, an intermediate layer, a perpendicular recording layer and a protection layer in a DC magnetron sputtering method (see JP2005-038596A, for example). The magnetic domain control layer includes a non-magnetic layer and an antiferromagnetic layer.

Figure 11D:
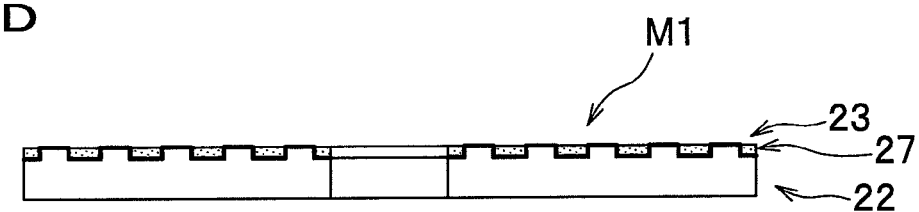

Next, as shown in FIG. 11D, non-magnetic material 27 was applied on the magnetic recording medium formation layer 23, whereby the surface of the glass substrate 22 was smoothed. Accordingly a discrete track medium M1 that was approximately 200 Gbpsi in terms of area density was obtained.

Example 4

Another example of a method for manufacturing a discrete track medium by using the imprint method of the present invention will be described with reference to the drawings if necessary.

Of the drawing to be referred to hereinafter, FIGS. 12A to 12E are views for explaining a manufacturing process of the discrete track medium.

Figure 12A:
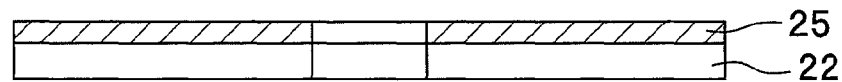
FIGS. 12A to 12E are views for explaining a manufacturing process of a discrete track medium.
Figure 12B:
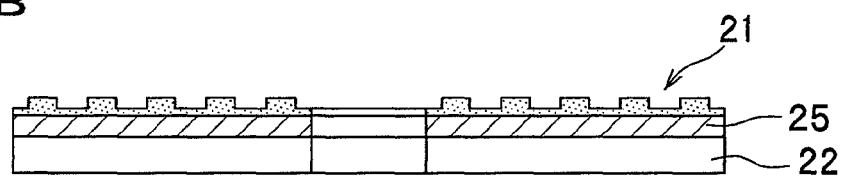

In Example 4, there was prepared a following substrate instead of using the glass substrate 22 having the pattern formation layer 21 that was obtained in the Example 1. As shown in FIG. 12B, this substrate was formed such that a soft magnetic underlayer 25 was formed on a glass substrate 22. Then, as similar in Example 1, on this substrate, there was provided a pattern formation layer 21 constituted of the photo curable resin 6, on which the surface structure of the stamper 2 had been transferred.

Figure 12C:
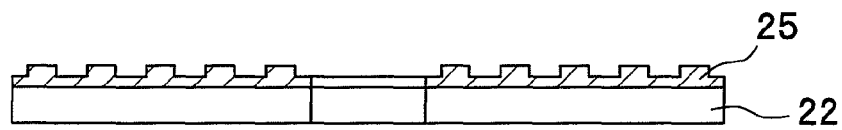

Next, the soft magnetic underlayer 25 was processed in a conventional dry etching method, using the pattern formation layer 21 as a mask. As a result, as shown in FIG. 12C, a structure corresponding to the pattern of the pattern formation layer 21 was etched on the surface of the soft magnetic underlayer 25. In this example, fluorine-containing gas was used for the dry etching.

Figure 12D:
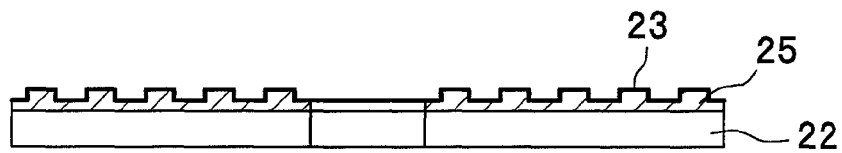

Then, as shown in FIG. 12D, on the surface of the soft magnetic underlayer 25 having the etched structure thereon, there was provided a magnetic recording medium formation layer 23 including a pre-coat layer, a magnetic domain control layer, a soft magnetic underlayer, an intermediate layer, a perpendicular recording layer and a protection layer in a DC magnetron sputtering method (see JP2005-038596A, for example). It should be noted that, in this example, the magnetic domain control layer is constituted of a non-magnetic layer and an antiferromagnetism layer, for example.

Figure 12E:
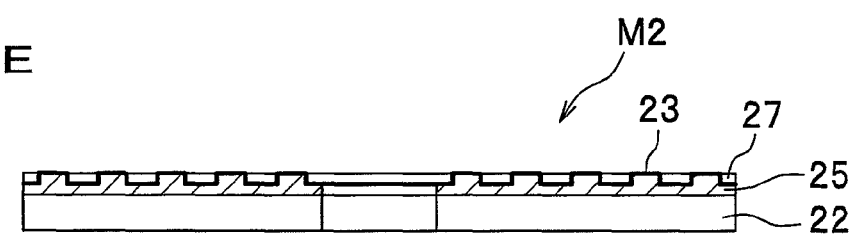

Next, as shown in FIG. 12E, the non-magnetic material 27 was applied on the magnetic recording medium formation layer 23, whereby the surface of the soft magnetic underlayer 25 was smoothed. Accordingly, a discrete track medium M2 that was approximately 200 Gbpsi in terms of area density was obtained.

Example 5

A method for manufacturing a disk substrate for a discrete track medium by using the imprint method of the present invention will be described with reference to drawings if necessary. Of the drawings to be referred to hereinafter, FIGS. 13A to 13E are views for explaining a manufacturing process of the disk substrate for the discrete track medium.

Figure 13A:
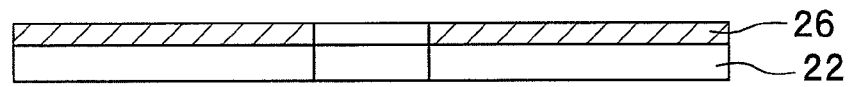
FIGS. 13A to 13E are views for explaining a manufacturing process of a disk substrate for a discrete track medium.
Figure 13B:
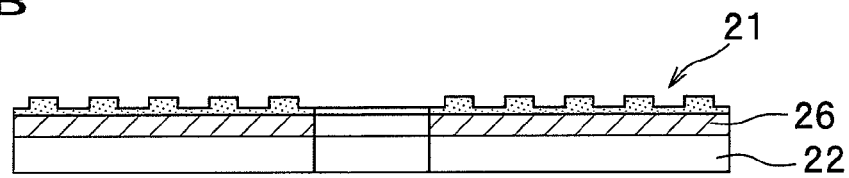

As shown in FIG. 13A, novolak resin was previously applied on the surface of the glass substrate 22 so as to form a flat layer 26. This flat layer 26 may be formed, for example, by using a spin-coating method or a method of pressing the resin with a plate. Next, as shown in FIG. 13B, the pattern formation layer 21 was formed on the flat layer 26. This pattern formation layer 21 was formed by applying a resin containing silicon on the flat layer 26 and using the imprint method of the present invention.

Figure 13C:
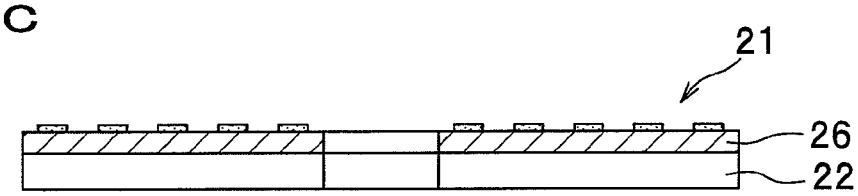
Figure 13D:
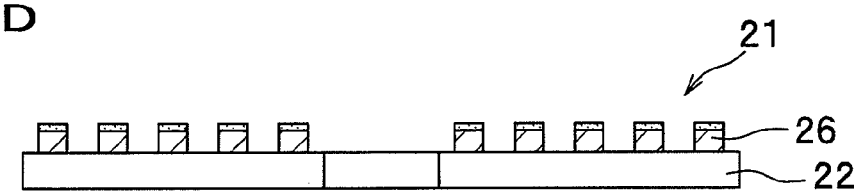
Figure 13E:
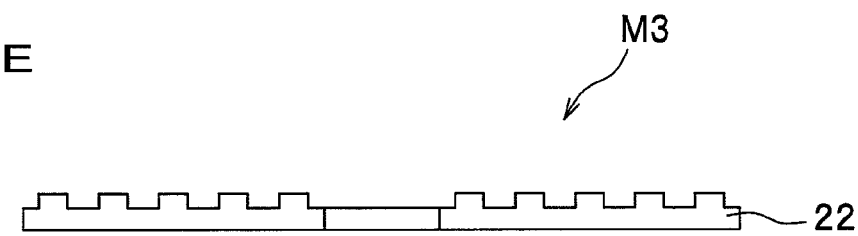

As shown in FIG. 13C, a thin film part of the pattern formation layer 21 was removed in a dry etching method in which fluorine-containing gas was used. Next, as shown in FIG. 13D, the flat layer 26 was removed by an oxygen plasma etching, using the remaining pattern formation layer 21 as a mask. Then, the surface of the glass substrate 22 was etched by the fluorine-containing gas, and thereafter, the remaining pattern formation layer 21 was removed, so that a disk substrate M3 used for a discrete track medium that was approximately 200 bpsi in terms of area density.

Example 6

Another example of a method for manufacturing a disk substrate for a discrete track medium by using the imprint method of the present invention will be described with reference to the drawings if necessary. Of the drawings to be referred to hereinafter, FIGS. 14A to 14E are views for explaining a manufacturing process of the disk substrate for the discrete track medium.

Figure 14A:
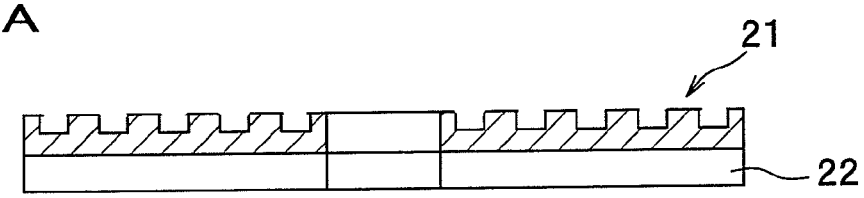
FIGS. 14A to 14E are views for explaining a manufacturing process of a disk substrate for a discrete track medium in another example.
Figure 14B:
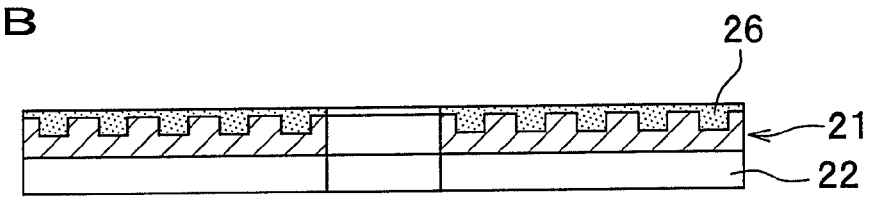
Figure 14C:
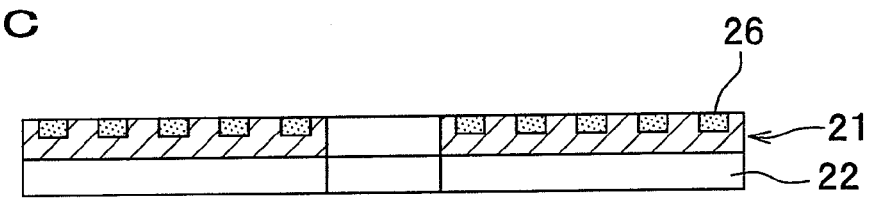
Figure 14D:
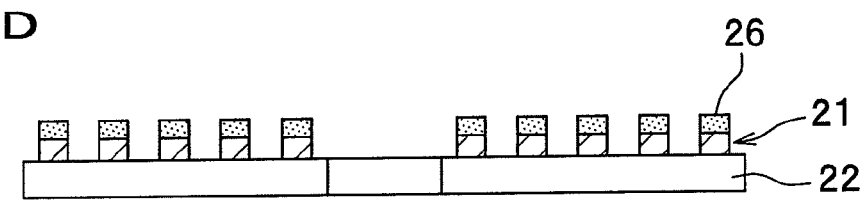
Figure 14E:
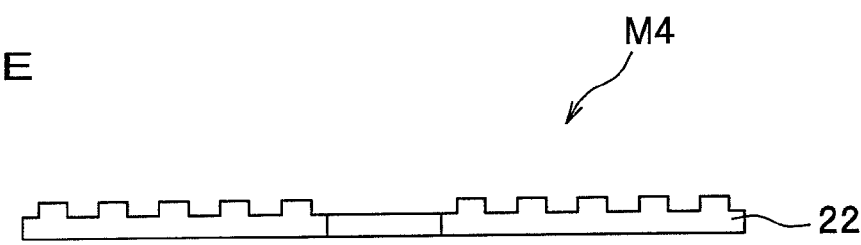

As shown in FIG. 14A, acrylate resin in which photosensitive material was added was applied on a glass substrate 22, and the pattern formation layer 21 was formed on the glass substrate 22 by using the imprint method of the present invention. In Example 6, the pattern formation layer 21 having patterns reversed to those to be formed was formed on the glass substrate 22. Then, as shown in FIG. 14B, silicon/photosensitive material containing resin was applied on the surface of the pattern formation layer 21, so as to form the flat layer 26. This flat layer 26 may be formed, for example, by using a spin-coating method or a method of pressing the resin with a plate. Then, as shown in FIG. 14C, the surface of the flat layer 26 was etched with a fluorine-containing gas, so that an uppermost face of the pattern formation layer 21 was exposed. Next, as shown in FIG. 14D, the pattern formation layer 21 was removed by an oxygen plasma etching, using the remaining flat layer 26 as a mask, whereby the upper surface of the glass substrate 22 was exposed. Then, the surface of the glass substrate 22 was etched by fluorine-containing gas, after which the remaining pattern formation layer 21 was removed, whereby a disk substrate M4 used for a discrete track medium that was approximately 200 bpsi in terms of area density was obtained, as shown in FIG. 14E.

Example 7

In Example 7, descriptions will be provided on an optical information processor that was manufactured by using the imprint method of the present invention.

Figure 15:
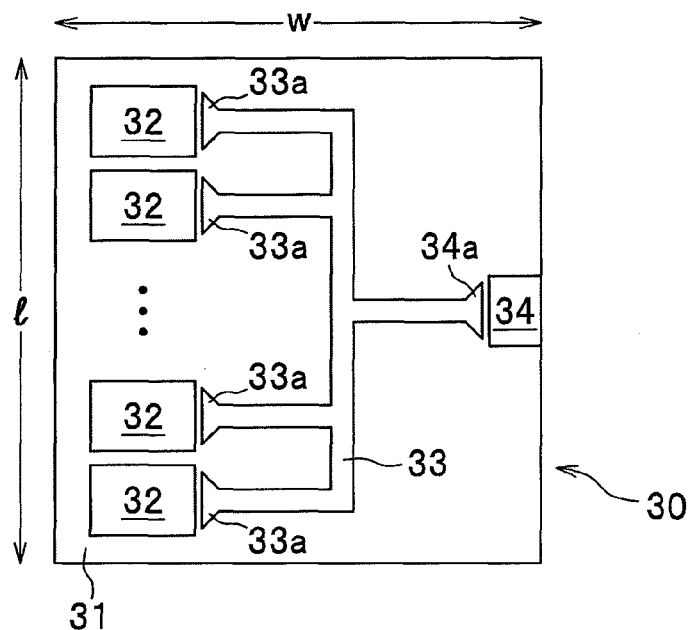
FIG. 15 is a block diagram of an optical circuit as a basic component of an optical device.
Figure 16:
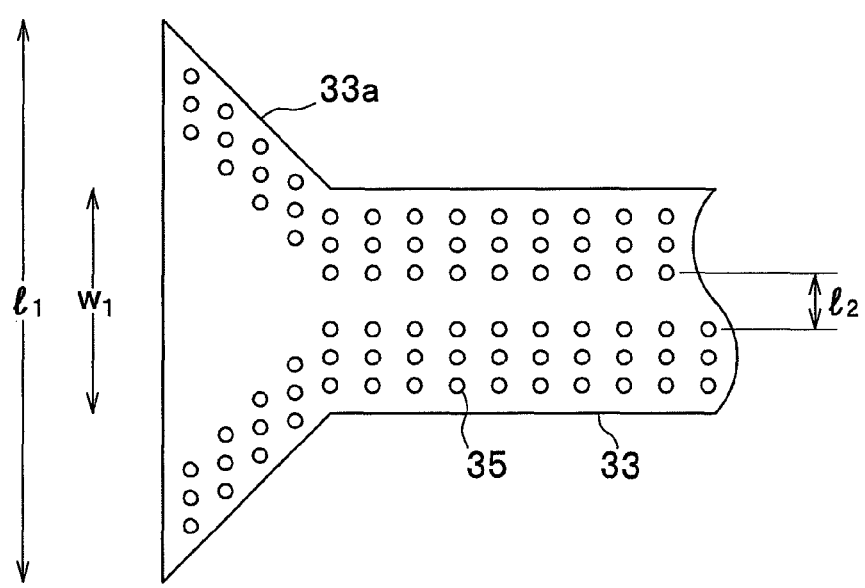
FIG. 16 is a schematic diagram showing a structure of a waveguide of the optical circuit.

In Example 7, descriptions will be provided on an example in which an optical device that changes a traveling direction of an incident light was applied to an optical information processor used in an optical multiplexing communication system. FIG. 15 is a block diagram of an optical circuit as a basic component of the optical device. FIG. 16 is a schematic diagram showing a structure of a waveguide of the optical circuit.

As shown in FIG. 15, the optical circuit 30 was formed on a substrate 31 of aluminum nitride having a length of 30 mm (l), a width of 5 mm (w) and a thickness of 1 mm. The optical circuit 30 includes plural oscillation units 32 including an indium phosphorus-based semiconductor laser and a driver circuit; optical waveguides 33, 33a, and optical connectors 34, 34a. Each semiconductor laser is defined to have a different oscillation wavelength from one another by 2 to 50 nm.

In the optical circuit 30, an optical signal input from each oscillation unit 32 through the waveguides 33 and 33a is transmitted to the connector 34 via the connector 34a. The optical signal from each waveguide 33a is multiplexed at the waveguide 33.

As shown in FIG. 16, plural fine projections 35 are projectedly provided inside the waveguide 33. The waveguide 33a has an input portion in a trumpet-like shape with a width $l_1$ of 20 µm in a sectional plan view, so as to tolerate alignment errors that occur between the oscillation unit 32 and the waveguide 33. In the trumpet-like portion of the waveguide 33a, a group of fine projections 35 are provided to form patterns such that an area in absence of the fine projections 35 becomes narrower gradually from a width $W_1$ on the input portion side, and a signal light propagates along the area in absence of the fine projections 35. At a center of a straight portion that forms the waveguide 33, a line of fine projections 35 are absent, so as to provide an area $l_2$ free from a photonic bandgap, whereby the optical signal is guided from the trumpet-like area into an area $l_2$ with a width of 1 µm. A pitch between each fine projection 35 is defined to be 0.5 µm. It should be noted that the fine projections 35 illustrated in the FIG. 16 are exemplified in less numbers than actual ones for convenience.

The present invention is applied to the waveguides 33, 33a and the optical connector 34a.

Specifically, as described above in details, the imprint method of the present invention is utilized for alignment between the substrate 31 and the stamper 2 (see FIG. 1A). This imprint method is utilized for forming predetermined fine projections 35 in the predetermined waveguides 33, 33a and the optical connector 34a. The optical connector 34a has a right and left reversed (mirror symmetry) structure of the waveguide 33a of FIG. 16; therefore, alignment of the fine projections 35 in the optical connector 34a is mirror symmetry to that of the fine projections 35 in the waveguide 33a of FIG. 16.

An equivalent diameter (diameter or one side) of the fine projection 35 may be arbitrarily defined in 10 nm to 10 µm, depending on the wavelength of a light source used for a semiconductor laser. The height of the fine projection 35 is preferably defined to 50 nm to 10 µm. A pitch (distance) between each fine projection 35 may be defined to be half a concerned signal wavelength.

Such an optical circuit 30, which usually multiplies signal lights in different wavelength and outputs it, can change a light traveling direction, so that a width W of the optical circuit 30 (see FIG. 15) can be significantly reduced to as small as 5 mm. This contributes to a reduction in size of an optical device. In addition, the imprint method of the present invention can form fine projections 35 through a transfer from the surface structure of the stamper 2 (see FIG. 1A, etc.), resulting in a reduction in production cost of the optical circuit 30. Example 7 is exemplified to be applied to an optical device that multiplies input lights. However, the present invention may be utilized in any optical device that controls a light path.

Example 8

Figure 17:
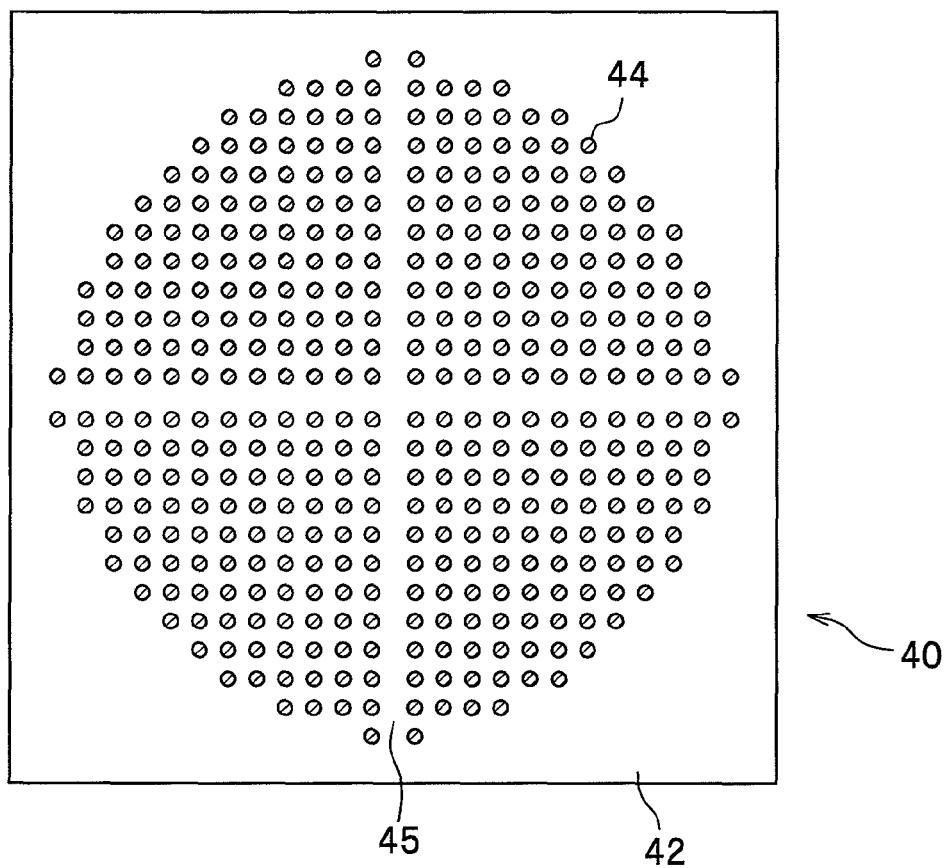
FIG. 17 is a plane view of cell culture sheet.

In Example 8, descriptions will be provided on a biodevice that is produced by using the imprint method of the present invention. FIG. 17 is a plane view of cell culture sheet.

As shown in FIG. 17, the cell culture sheet 40 includes a thin film (sheet) 42 of PMMA with a thickness of 0.5 µm and fine projections 44 that are mainly composed of PMMA and provided on the thin film 42. The fine projections 44 has a height of 1 µm and are aligned at a pitch of 1 µm. Each fine projections 44 has a column shape and a diameter of 500 nm. Such a structure as the fine projections 44 are formed on the thin film 42 is realized by using the imprint method of the present invention to press patterns of the stamper 2 onto a resin layer of PMMA. The resin layer of PMMA as the material to be patterned 1 and the stamper 2 are aligned by using this imprint method of the present invention.

Figure 18:
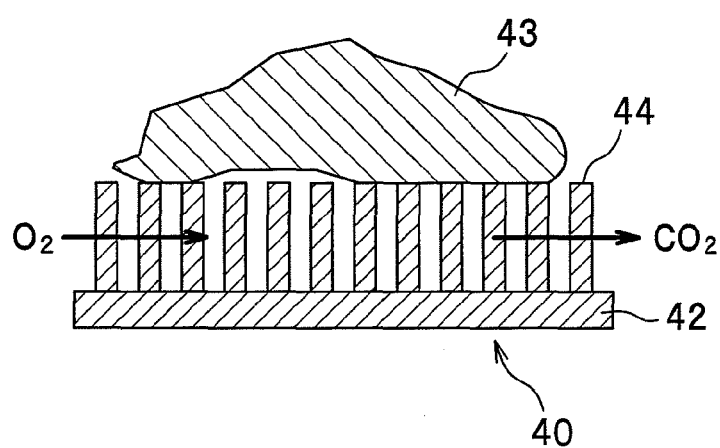
FIG. 18 is a schematic diagram showing an example of cell culture using cell culture sheet.

Next, some of the fine projections 44 are removed so as to be form a cross-shaped clearance, as shown in FIG. 17. The cell culture sheet 40 is put into a container such as a glass Petri dish, which is soaked in culture fluid. FIG. 18 is a schematic diagram showing an example of cell culture using the cell culture sheet 40. As shown in FIG. 18, the culture fluid 43 containing cells (tissue) of skin, bone or blood, culture medium and nutrient, etc. is put on the cell culture sheet 40 so as to culture the cells.

The cell culture sheet 40 has a constant clearance 45 (see FIG. 17) that are formed by removing some of the fine projections 44, thereby to allow the culture fluid 43 to easily moves along the clearance 45, so that the nutrient is efficiently supplied for the cells to be cultured; at the same time, waste products of the cells in the cell culture process are efficiently drained.

With such a cell culture sheet 40, it is possible to significantly reduce damages to cells, which may be caused in a cell culture using a glass Petri dish when cells come off from the dish; resulting in enhancement of colonization in cell transplantation. As shown in FIG. 18, the clearance 45 (see FIG. 17) is formed by absence of the fine projections 44 on the cell culture sheet 40, on which the sheet-like epidermal cells are cultured. Since this clearance 45 is provided below the sheet-like epidermal cells, the culture fluid 43 is smoothly supplied for the entire cells to be cultured. Accordingly, efficient supply of nutrients and efficient drains of waste products can be obtained, thereby to reduce destruction of cells under cultivation, which has been a conventional disadvantage.

Next, one specific example of the cell culture sheet 40 according to the imprint method of this example will be described as below. While the cell culture sheet 40 produced by using the imprint method of this example was placed in a Petri dish in such a manner that the sheet 40 was soaked in culture fluid, normal human epidermal keratinocytes (NHEK) was cultured on the cell culture sheet 40.
For this cultivation, HuMedia-KB2 manufactured by KURABO INDUSTRIES LTD. was used as a culture medium, and the cultivation temperature was 37° C. and the cultivation was carried out in a flow of $CO_2$ of 5%. As a result, epidermal keratinocyte cells were securely attached on the cell culture sheet 40, and were normally cultured in a sheet-like manner. The cells cultured in a sheet shape were taken off after 14 days since the cell culture was initiated, so that sheet shaped epidermal keratinocyte cells with less damages were obtained.

As the fine projections 44, material of hydrophilic property that is formed of plasma-processed macromolecule may be used. The material of macromolecule is not limited to a specific one, and it is preferable to select material having smaller influence on cells (tissues) to be cultured, more preferable to use Polystyrene, PMMA, polylactic acid or the like.

As for a bio device, the imprint method of the present invention may be applied to medical/diagnostic tools, specifically called as µTAS, in which fine structures are fabricated on a surface thereof; or to detection/synthesis means in a medical/chemical purpose.

Example 9

In Example 9, descriptions will be given on a method of producing a multilayer interconnection substrate by using the imprint method of the present invention. FIGS. 19A to 19L are drawings for explaining a process of producing this multilayer interconnection substrate.

Figure 19A:
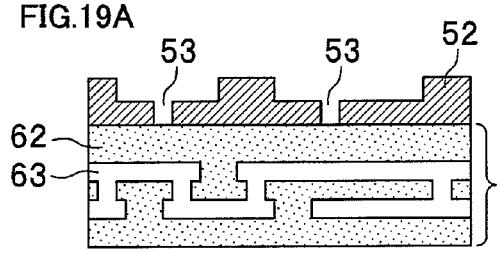
FIGS. 19A to 19L are drawings for explaining a process of producing a multilayer interconnection substrate.

As shown in FIG. 19A, after a resist 52 is formed on a surface of the multilayer interconnection substrate 61 including a silicon oxide film 62 and copper interconnections 61, a pattern transfer is performed by using a stamper (not shown). Prior to performing the pattern transfer, the stamper 2 and the substrate are aligned with each other, and then desired interconnection patterns are transferred onto a desired position on the substrate.

Figure 19G:
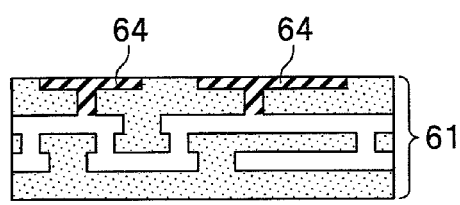
Figure 19B:
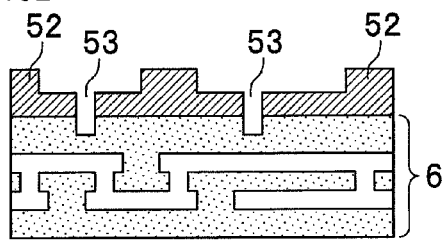
Figure 19H:
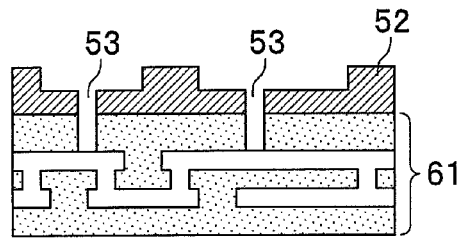
Figure 19C:
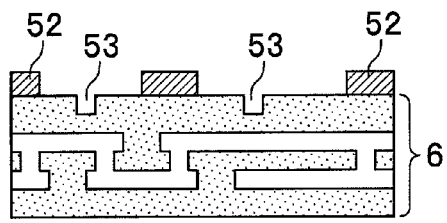

An exposure area 61 of the multilayer interconnection substrate 61 is dry-etched by CF4/H2 gas, so as to form grooves in the exposure area 53 on the surface of the multilayer interconnection substrate 61, as shown in FIG. 19B. Next, the resist 52 is resist-etched by using RIE. The resist-etching process is maintained until the resist 52 portion at a lower step is removed, whereby the exposure area 53 of the multilayer interconnection substrate 61 becomes enlarged around the remaining resist 52, as shown in FIG. 19C. From this stage, a dry-etching operation is further performed on the exposure area 53, whereby the grooves already formed in the exposure area 53 at the previous step are further processed to reach the copper interconnections 63.

Figure 19I:
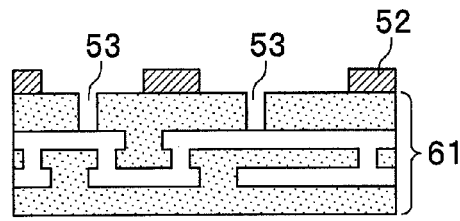
Figure 19D:
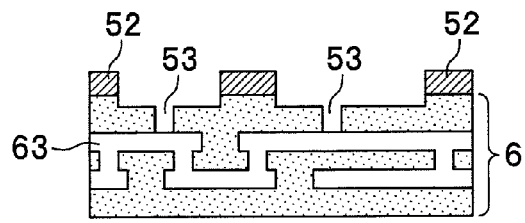
Figure 19J:
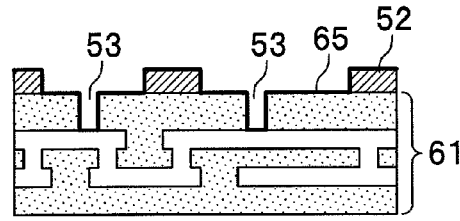
Figure 19E:
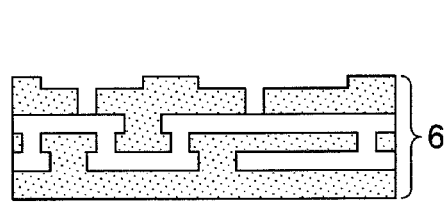
Figure 19K:
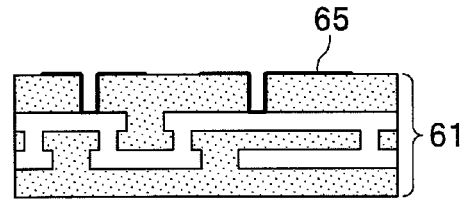
Figure 19F:
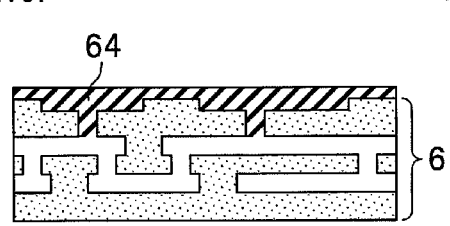

Next, the remaining resist 52 is removed so as to obtain the multilayer interconnection substrate 61 having a groove structure on the surface thereof, as shown in FIG. 19E. After a metal film (not shown) is formed on the surface of the multilayer interconnection substrate 61, a metal-plated film 64 is further formed on the substrate thereof by electrochemical plating, as shown in FIG. 19F. Thereafter, the metal-plated film 64 is polished until the silicon oxide film 62 of the multilayer interconnection substrate 61 is exposed. Accordingly, as shown in FIG. 19G, the multilayer interconnection substrate 61 having metal interconnections of the metal-plated film 64 on the surface thereof is obtained.

Now, another process of producing the multilayer interconnection substrate 61 will be described.

Figure 19L:
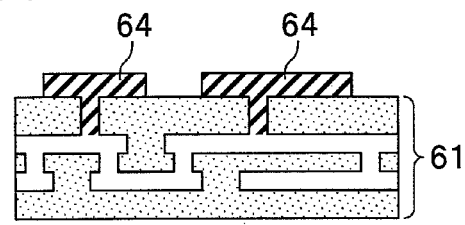

The exposure area 53 at the stage of FIG. 19A is further processed by the dry-etching until the etching reaches the copper interconnections 63 inside the multilayer interconnection substrate 61. Then, the resist 52 is etched by using RIE so as to remove the resist 52 portion at a lower step, as shown in FIG. 19I, and thereafter, the metal film 65 is formed on the surface of the multilayer interconnection substrate 61 by using sputtering, as shown in FIG. 19J. After the remaining resist 52 is removed in a lift-off process, the metal film 65 partially remains on the surface of the multilayer interconnection substrate 61, as shown in FIG. 19K. Then, the partially remaining metal film 65 is electroless-plated. Accordingly, the multilayer interconnection substrate 61 is obtained as shown in FIG. 19L, in which metal interconnections of the metal-plated film 64 is provided on the surface thereof. As described above, the present invention can be applied to such a multilayer interconnection substrate 61 so as to provide metal interconnections in high accuracy.

According to the imprint apparatus and method of the present invention can prevents bubbles from remaining between a stamper and material to be patterned, so as to realize an accurate patterning.

The embodiments according to the present invention have been explained as aforementioned. However, the embodiments of the present invention are not limited to those explanations, and those skilled in the art ascertain the essential characteristics of the present invention and can make the various modifications and variations to the present invention to adapt it to various usages and conditions without departing from the spirit and scope of the claims.

What is claimed is:

1. An imprint apparatus transferring a surface structure of a stamper to material to be patterned by allowing the stamper come in contact with the material to be patterned,
   the imprint apparatus comprising:
   a holding means that holds the material to be patterned and the stamper with a distance therebetween;
   a pressure reduction means that reduces pressure of a chamber in which the material to be patterned and the stamper are placed; and
   an alignment means that aligns the stamper with the material to be patterned,
   wherein
   the alignment means comprises at least one displacement member that moves in a direction parallel to the plane of contact between the material to be patterned and the stamper, and
   when displaced, the displacement member is pressed at the material to be patterned or the stamper.

2. An imprint apparatus according to claim 1, wherein the displacement member is pressed at least either inner circumferential edge of a center hole formed in the material to be patterned or of a center hole formed in the stamper so as to align the stamper with the material to be patterned.

3. An imprint apparatus according to claim 1, wherein the displacement member is pressed at least either outer circumferential edge of the material to be patterned or of the stamper so as to align the stamper with the material to be patterned.

4. An imprint apparatus according to claim 1, wherein
   a face of the displacement member that is pressed at least either the material to be patterned or the stamper has a flat face, and
   the flat face has an angle within ±2° relative to a normal line to the contact faces of the material to be patterned and the stamper.

5. An imprint apparatus according to claim 1, wherein,
   the holding means is provided on the displacement member, and is pressed at least either the material to be patterned or the stamper so as to hold the material to be patterned and the stamper with a distance therebetween.

6. An imprint apparatus according to claim 5, wherein,
   the holding means includes a locking portion that is pressed at least either the material to be patterned or the stamper so as to lock at least either the material to be patterned or the stamper, and
   the displacement member includes a flat face that is pressed at least either the material to be patterned or the stamper.

7. An imprint apparatus according to claim 1, wherein,
   the alignment means includes a rotational driving unit that rotates at least either the material to be patterned or the stamper around an axis thereof so as to align the stamper with the material to be patterned.

8. An imprint apparatus according to claim 7, wherein,
   reproducibility of the alignment between the material to be patterned and the stamper by using the rotational driving unit falls within ±10° in terms of a deviation of the rotational angle.

9. An imprint apparatus according to claim 1, wherein,
   the alignment means includes a detector that reads a position of a marker provided on either the material to be patterned or on the stamper so as to detect an alignment between the material to be patterned and the stamper.

10. An imprint apparatus according to claim 1, wherein a pair of stampers are provided in such a manner that the material to be patterned is sandwiched between the stampers.

11. An imprint apparatus according to claim 1, further comprising a separating means that separates the material to be patterned and the stamper.

12. An imprint method for transferring a surface structure of a stamper onto material to be patterned,
    the method comprising:
    a first step of holding the material to be patterned and the stamper with a distance therebetween;
    a second step of reducing pressure of a chamber in which the material to be patterned and the stamper; and
    a third step of aligning the stamper with the material to be patterned,
    wherein
    the third step is performed after the material to be patterned and the stamper come in contact with each other, and
    in the third step, the material to be patterned or the stamper moves in a direction parallel to the plane of contact between the material to be patterned and the stamper.

13. An imprint method according to claim 12, wherein
    the material to be patterned and the stamper comes in contact with each other through a material to be processed of a different kind from that of the material to be patterned, and
    the surface structure of the stamper is transferred to the material to be processed on the material to be patterned.

14. An imprint method according to claim 13 wherein the material to be processed is a photo curable resin, which is cured by electromagnetic waves radiated through at least either the material to be patterned or the stamper.

15. An imprint method according to claim 12 wherein
    in the third step, the alignment means includes a rotational driving unit that rotates at least either the material to be patterned or the stamper around an axis thereof so as to align the stamper with the material to be patterned.

16. An imprint method according to claim 12, wherein a pair of stampers are provided in such a manner that the stampers sandwich the material to be patterned.

17. An imprint method according to claim 12 further comprising a fourth step of transferring the surface structure of the stamper to the material to be patterned by applying a load to the material to be patterned and the stamper after the third step.

* * * * *